United States Patent
Yoshida et al.

(10) Patent No.: US 6,462,382 B2
(45) Date of Patent: Oct. 8, 2002

(54) MOS TYPE SEMICONDUCTOR APPARATUS

(75) Inventors: Kazuhiko Yoshida; Tatsuhiko Fujihira; Motoi Kudoh; Shoichi Furuhata; Shigeyuki Takeuchi, all of Kawasaki (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/811,736

(22) Filed: Mar. 19, 2001

(65) Prior Publication Data

US 2001/0010379 A1 Aug. 2, 2001

Related U.S. Application Data

(62) Division of application No. 09/238,855, filed on Jan. 27, 1999, now Pat. No. 6,229,180.

(30) Foreign Application Priority Data

Jan. 27, 1998 (JP) .............................. 10-014590
Mar. 17, 1998 (JP) .............................. 10-066757

(51) Int. Cl.$^7$ .............................................. H01L 23/62
(52) U.S. Cl. ...................... 257/355; 257/139; 257/339; 257/358; 257/356; 257/603; 257/487; 257/355; 361/56
(58) Field of Search ................................ 257/355, 358, 257/139, 356, 603, 339, 487; 361/156

(56) References Cited

U.S. PATENT DOCUMENTS

| | | | |
|---|---|---|---|
| 4,975,798 A | 12/1990 | Edwards et al. | 361/56 |
| 5,151,767 A | 9/1992 | Wong | 357/43 |
| 5,289,028 A | 2/1994 | Clark et al. | 257/355 |
| 5,362,980 A | 11/1994 | Gough | 257/467 |
| 5,530,271 A | 6/1996 | Fallica | 257/173 |
| 5,557,127 A | 9/1996 | Ajit et al. | 257/339 |
| 5,883,402 A | 3/1999 | Omura et al. | 257/146 |
| 5,903,025 A | 5/1999 | Quoirin et al. | 257/328 |
| 5,959,345 A | 9/1999 | Fruth et al. | 257/605 |
| 6,091,086 A | 7/2000 | Zommer | 257/121 |

FOREIGN PATENT DOCUMENTS

JP 09186315 A 7/1997

OTHER PUBLICATIONS

"High Voltage Ignition Power IC with a Depletion Mode IGBT"; R.S. Wrathall, Proc. of the Symposium on High Voltage and Smart Power Devices; pp. 383–391; 1989.

Primary Examiner—Caridad Everhart
Assistant Examiner—B. V. Keshavan
(74) Attorney, Agent, or Firm—Rossi & Associates

(57) ABSTRACT

A MOS type semiconductor apparatus is provided which includes a main MOS type semiconductor device, an internal control circuit connected between a control input terminal (G) and a control input port (g) of the main MOS type semiconductor device, and a protecting device connected between the control input terminal (G) and one of output terminals (S) of the apparatus, for protecting the semiconductor device or internal control circuit against overvoltage. The protecting device includes a first branch including a Zener diode ($Z_{1p}$) consisting of a polysilicon layer deposited on an insulating film over the semiconductor substrate, and a second branch including a Zener diode ($Z_{21}$) formed in a surface layer of the semiconductor substrate, and a diode ($Z_{3pr}$) that consists of a polysilicon layer deposited on an insulating film over the semiconductor substrate, and is connected in series with the Zener diode ($Z_{21}$) in a reverse direction. The first and second branches are connected in parallel with each other.

15 Claims, 13 Drawing Sheets

MOS TYPE SEMICONDUCTOR APPARATUS

This is a Division of application Ser. No. 09/238,855 filed Jan. 27, 1999. U.S. Pat. No. 6,229,180.

FIELD OF THE INVENTION

The present invention relates to a MOS type semiconductor apparatus, such as a MOS field-effect transistor (hereinafter referred to as "MOSFET") or an insulated gate bipolar transistor (hereinafter referred to as "IGBT"), wherein a plurality of source regions having gates of metal-oxide film-semiconductor (MOS) structure are separately formed in a surface layer of a semiconductor substrate.

BACKGROUND OF THE INVENTION

To produce a MOSFET as one type of MOS type semiconductor device, a p base region is formed by diffusing impurities into a selected area of a surface layer of an n type semiconductor substrate such that a pn junction appears on the surface of the substrate, and an n source region is formed in a surface layer of the p base region in a similar manner. A gate electrode is then formed on an insulating film, over the surface of a channel region provided by a surface layer of the p base region that is interposed between the n source region and the n type semiconductor substrate. Also, a source electrode is formed in contact with both the p base region and the n source region, and a drain electrode is formed on the other surface of the n type semiconductor substrate. By applying a suitable voltage to the gate electrode, an inversion layer appears in the channel region, to reduce resistance between the drain electrode and the source electrode, so that current flows between the drain electrode and the source electrode through the inversion layer.

To produce IGBT as another type of MOS type semiconductor device, an additional p type region is formed on the side of the drain electrode of the MOSFET. With the p type region thus added, the IGBT is capable of modulating the conductivity, utilizing injection of minority carriers.

The MOS type semiconductor devices as described above have been widely used in switching circuits because the devices provide low ON-state resistance and high switching speed, and can be easily controlled by changing voltage applied thereto.

In recent years, MOS type semiconductor devices used as switching elements in switching currents are more likely to receive surge voltage generated in the circuits, because of simplification of the circuits from which snubbers are eliminated, and reduction in the size of the semiconductor devices. When such a MOS type semiconductor device operates to stop current flow from an inductive load, for example, the voltage applied to the semiconductor device increases due to energy stored in an inductor, and may become even higher than the power supply voltage in some cases. The resulting overvoltage stress may cause breakdown of the MOS type semiconductor device. Thus, the semiconductor device used as a switching element has been desired to have an increased breakdown voltage or higher capability to withstand avalanche breakdown.

In the meantime, as a new trend of the MOS type semiconductor device, so-called intelligent devices, in other words, MOS type semiconductor apparatuses including MOS type semiconductor devices, have been used in these days. In this type of apparatus, the semiconductor device is integrated with a circuit that senses overcurrent, temperature, or the like, and feeds detection signals back to the gate. In such a MOS type semiconductor apparatus, it is particularly important to protect its gate and control input terminal against surge voltage.

FIG. 14 is a circuit diagram showing an equivalent circuit of a MOS type semiconductor apparatus provided with an arrangement for protecting the gate.

In this apparatus, a Zener diode 5 is connected between the source S and the gate G of a main MOS type semiconductor device 2. The Zener diode 5 functions to protect the device by bypassing current when overvoltage or excess voltage is applied to the gate G. A resistance 6 functions to prevent high-voltage noise from being applied to the gate G due to disconnection of a gate lead, for example. Between the drain D and the gate G is connected a series Zener diode array 3 in which a large number of pairs of Zener diodes are connected in series such that each pair of diodes are formed back to back. If the voltage applied to the drain D becomes higher than the clamp voltage of the series Zener diode array 3, a difference between the drain voltage and the clamp voltage is applied to the gate G, so as to turn on the main MOS type semiconductor device 2, thereby protecting the device from the overvoltage.

The series Zener diode array 3 connected between the drain D and the gate G is formed using polycrystalline silicon or polysilicon that is deposited on an insulating film over a semiconductor substrate of the MOS type semiconductor apparatus, as disclosed in U.S. Pat. No. 5,365,099.

The inventors of the present invention fabricated an intelligent IGBT that includes a Zener diode between the gate G and the source S for protecting the device against surge voltage, a means for detecting overcurrent, or the like, and an IGBT as a MOS type semiconductor device that provides the output stage. FIG. 15 shows an equivalent circuit of the intelligent IGBT. The gate G of the semiconductor apparatus is connected to a gate (g) of a main IGBT 4 as the output stage, via an internal control circuit 9 for sensing and computing. A Zener diode 5 connected between the gate G and the source S serves to protect the device against surge voltage. When an overvoltage is applied to the gate G, the Zener diode 5 performs a bypassing functions so as to protect the device against the overvoltage. A series Zener diode array 3 having a large number of pairs of Zener diodes is connected between the drain D and the gate g of the main IGBT. Each pair of the Zener diodes are formed back to back, namely, the anodes of each pair of the diodes are connected to each other, and adjacent pairs are connected with corresponding cathodes facing with each other. If a high voltage applied to the drain D becomes higher than the clamp voltage of the series Zener diode array 3, a difference between the drain voltage and the clamp voltage is applied to the gate g of the main IGBT 4, to turn on the main IGBT 4, thereby protecting the device from the overvoltage. A power supply of the internal control circuit 9 is taken from the control input terminal G. In the circuit of FIG. 15, the power supply terminal $V_{DD}$ is directly connected to the control input terminal G. The Zener diode 5 and the series Zener diode array 3 are formed by depositing polysilicon on an insulating film over the semiconductor device.

A surge voltage test was conducted on the device thus fabricated. FIG. 16(a) shows a test circuit, and FIG. 16(b) shows waveforms obtained in the test.

After a switch s1 was closed and a capacitor C was charged by a power supply Vcc, the switch s1 was opened. Then, a switch s2 was closed, and a test voltage was applied to a test device (DUT). The capacitance C was 33 μF, and resistances Ra and Rb were 100 Ω and 75 Ω, respectively, while the power supply voltage was varied in the range of 30 to 500 V.

As shown in FIG. 16(b), the waveform of the voltage applied to the test device takes the form of a pulse having a width of about 9ms, which rapidly rises in the initial period, and then gradually decreases.

In the surge voltage test, if the test voltage was increased to be larger than 100 V, some test devices broke down. In many cases, the breakdown occurred at around the Zener diode 5.

The semiconductor apparatus as described above has another problem. To integrate the internal control circuit with the IGBT, the known apparatus employs an isolation structure using an embedded layer as reported by Wrathall, R. S. et al. in Proc. of the Symposium on High Voltage and Smart Power Devices, p.384, (1989), or an SOI isolation structure in which the control circuit is isolated by means of the substrate of the IGBT and an oxide film, for example. These methods, however, requires complicated and numerous process steps, which result in increased cost. In the production of the IGBT as described above, the inventors did not use these methods, but employed a self isolation structure as the simplest one that shortens the fabrication process, when integrating the internal control circuit with the IGBT.

FIG. 17 is a cross-sectional view showing an internal control circuit portion integrated on the MOS type semiconductor apparatus. This portion includes an p+drain layer 21, n+buffer layer 22, n drift layer 23, and a drain electrode 30, which are shared by the IGBT portion of the output stage. A p− well 34 is formed in a surface layer of the n drift layer 23, and an enhancement-type n charmer MOSFET 51 and a depletion-type n channel MOSFET 61 are formed in and above a surface layer of the p− well 34. More specifically, n+drain regions 53, 63 are formed in the surface layer of the p− well 34, and drain electrodes 60, 70 are formed in contact with the surfaces of the n+ drain regions 53, 63, respectively. Also, n+ source regions 56, 66 are formed in the surface layer of the p− well 34, and source electrodes 59, 69 are formed in contact with the surfaces of the n+ source regions 56, 66. Reference numeral 64 denotes an n channel doped region for controlling the threshold voltage, and 58 and 68 denote gate electrode layers. The drain electrode 70 of the depletion-type n channel MOSFET 61 is connected to the power supply terminal ($V_{DD}$ in FIG. 15) of the internal control circuit.

In the self isolation structure as described above, the p+ drain layer 21, n+ buffer layer 22, n drift layer 23, p− well 34, and the n+ drain region 63 provides a pnpn four-layer structure. Namely, this structure involves a parasitic thyristor consisting of these four layers. The parasitic thyristor of the internal control circuit portion is forward-biased during the operation of the intelligent IGBT, or when a surge voltage is applied to make the control input terminal (G) negative with respect to the output terminal (S). The parasitic thyristor, when it is forward-biased, latches up as indicated by the arrow 71 in FIG. 17, and may result in breakdown of the device.

SUMMARY OF THE INVENTION

It is therefore an object of the present invention to provide a MOS type semiconductor apparatus including a Zener diode(s) for protection against surge voltage, which can be easily manufactured and operate with high reliability, assuring improved capability to withstand surge voltage, and in which a parasitic thyristor is unlikely to latch up.

To accomplish the above object, the present invention provides a MOS type semiconductor apparatus comprising: a semiconductor substrate; a main MOS type semiconductor device including a control portion of a metal-oxide film-semiconductor (MOS) structure; a first output terminal and a second output terminal to which two outputs of the main MOS type semiconductor device are connected; a control input terminal to which a control input of the main MOS type semiconductor device is connected; an internal control circuit connected between the control input terminal and the control input of said main MOS type semiconductor device; and a protecting device connected between the control input terminal and said first output terminal, for protection against overvoltage, the protecting device comprising a first branch including a first Zener diode comprising a polysilicon layer deposited on an insulating film over said semiconductor substrate, and a second branch including a second Zener diode formed in a surface layer of the semiconductor substrate and a third diode comprising a polysilicon layer deposited on an insulating film over the semiconductor substrate, the third diode being connected in series with the second Zener diode in a reverse direction, the first and second branches being connected in parallel with each other.

In the MOS type semiconductor apparatus as described above, the area of the Zener diode portion can be reduced due to the presence of the second Zener diode ($Z_{21}$) capable of withstanding a high voltage. Further, since the third diode consisting of a polysilicon layer is connected to the second Zener diode in the reverse direction, latch-up of a parasitic thyristor does not occur in the Zener diode portion.

In one preferred form of the invention, the sum of the breakdown voltage of the second Zener diode formed in the surface layer of the semiconductor substrate and the forward voltage of the reverse-connected third diode consisting of the polysilicon layer is made equal to or smaller than the breakdown voltage of the first Zener diode consisting of the polysilicon layer. In this case, the second Zener diode formed in the surface layer of the semiconductor substrate is able to effectively function to withstand a high voltage.

In another preferred form of the invention, the protecting device including the Zener diodes is located between an electrode pad of the control input terminal (G) and an electrode pad of die first output terminal (S), such that two electrodes of the Zener diodes are integrated with the electrode pad of the control input terminal and the electrode pad of the first output terminal, respectively.

If the anode electrode and cathode electrode of the Zener diode are integrated with a source pad and a gate pad, respectively, there is no need to draw wiring around for connection between these electrodes and the electrode pads.

In another preferred form of the invention, a branch in which a resistance and a Zener diode are connected in series is connected between the control input terminal (G) and the first output terminal (S), and a point between the resistance and the Zener diode is connected to the control input of the main MOS type semiconductor device. In a further preferred form of the invention, a plurality of resistances are connected in series between the control input terminal G and the control input of the main MOS type semiconductor device, and a Zener diode is connected between one side of each of the resistances that is closer to the control input of the main MOS type semiconductor device, and the first output terminal (S).

With this arrangement, the breakdown voltage of the Zener diode in the previous stage is applied across the Zener diode and the resistance in the later stage, and therefore the voltage applied to the control input of the main MOS type semiconductor device is reduced by an amount corresponding to a voltage drop across the resistance. If a large number of such stages are provided, the voltage applied to the control input of the main MOS type semiconductor device is reduced as the number of the stages increases.

Also, the forward voltage of the Zener diode in the previous stage is applied across the resistance and the Zener diode in the later stage, so that the forward voltage of the Zener diode in the later stage is applied to the control input of the main MOS type semiconductor device, thus preventing latch-up of a parasitic thyristor in the internal control circuit portion. If a large number of such stages are provided, the voltage applied to the control input of the main MOS type semiconductor device is reduced as the number of the stages increases.

The resistances ($R_1$, $R_2$, •••) and the Zener diodes ($Z_{5p}$, $Z_{6p}$, •••) are preferably formed of polysilicon. In this case, the semiconductor apparatus does not suffer from latch-up of a parasitic thyristor that would otherwise appear in the Zener diode portion or the internal control circuit portion.

It is also effective to provide a diode ($Z_{4pr}$) that is formed from a polysilicon layer deposited on an insulating film over the semiconductor substrate and oriented in a reverse direction with respect to the Zener diode ($Z_{1p}$), on the side of the power supply terminal of the internal control circuit. In this case, latch-up of a parasitic thyristor in the internal control circuit portion can be advantageously prevented.

If the Zener diode or diodes as described above include comb-like electrodes, the Zener diode(s) provides an increased length of pn junction, while requiring a reduced area.

According to the present invention, there is also provided a MOS type semiconductor apparatus, comprising a semiconductor substrate; a main MOS type semiconductor device including a control portion of a metal-oxide film-semiconductor (MOS) structure; a first output terminal and a second output terminal to which two outputs of the main MOS type semiconductor device are connected; a control input terminal to which a control input of the main MOS type semiconductor device is connected; and an internal control circuit connected between the control input terminal and the control input of the main MOS type semiconductor device, the internal control circuit comprising a MOS type semiconductor device that includes a control portion of a metal-oxide film-semiconductor (MOS) structure, and is integrated within a self-isolation region or a junction isolation region formed in a surface layer of the semiconductor substrate, wherein a channel region of the main MOS type semiconductor device is spaced at least 200 µm from a channel region of the MOS type semiconductor device of the internal control circuit.

In the MOS type semiconductor apparatus as described just above, carriers in the main MOS type semiconductor device are kept from flowing into the MOS type semiconductor device of the internal control circuit, and therefore latch-up of a parasitic thyristor can be advantageously prevented.

In particular, an amount of impurities in a self isolation region or junction isolation region formed in a surface layer of the semiconductor substrate is preferably controlled to be in a range of $1 \times 10^{13}$ to $1 \times 10^{14}$ cm$^{-2}$.

If the amount of the impurities is smaller than $1 \times 10^{13}$ cm$^{-2}$, the current amplification factor of a transistor that provides a parasitic thyristor is increased, and the parasitic thyristor is highly likely to latch up, as will be understood from the results of experiments as described later. If the amount of impurities is greater than $1 \times 10^{14}$ cm$^{-2}$, the threshold voltage of the MOS type semiconductor device of the internal control circuit is increased, thus making it impossible to drive the device with a low voltage.

Furthermore, the MOS type semiconductor apparatus may further include a lead electrode that is formed in contact with a surface of the self isolation region or the junction isolation region, and connected to the first output terminal (S), such that the lead electrode is spaced from the channel region of the MOS type semiconductor device of the internal control circuit by a distance of not greater than 100 µm. With this arrangement, the carriers that enter the self isolation region or junction isolation region are ejected or discharged from the lead electrode, and therefore latch-up of a parasitic thyristor can be prevented.

BRIEF DESCRIPTION OF THE DRAWING

The invention will be described in greater detail with reference to preferred embodiments thereof and the accompanying drawings, wherein.

DETAILED DESCRIPTION OF THE PREFERRED EMBODIMENTS

Some preferred embodiments of the present invention and experiments conducted for developing the present invention will be described in detail with reference to the drawings. In the following description, n or p prefixed to regions, layers and the like, mean that majority carriers in these regions and layers are electrons and holes, respectively, and n type is regarded as the first conductivity type while p type is regarded as the second conductivity type, though these conductivity types may be reversed.

Figure 3:
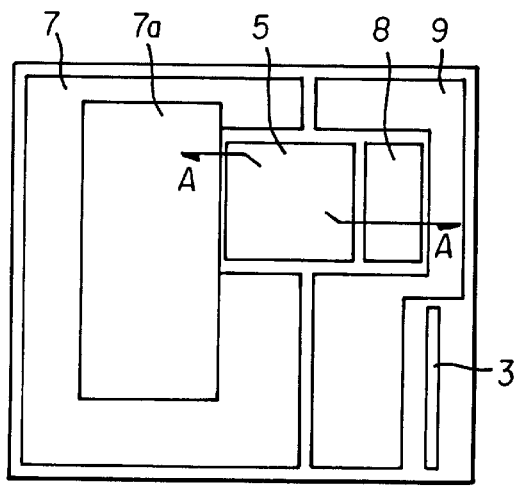
FIG. 3 is a plan view showing an intelligent IGBT according to the first embodiment of the present invention.

FIG. 3 is a plan view of an intelligent IGBT chip for an inductive load, which was produced as a test device for use in an ignitor of an automobile. The IGBT chip includes a source electrode 7, gate electrode 8, internal control circuit 9, Zener diode 5, and a series Zener diode array 3 provided for improving the capability to withstand avalanche breakdown. The Zener diode 5 and the series Zener diode array 3 are formed using polysilicon deposited on an insulating film over a semiconductor substrate.

Figure 4:
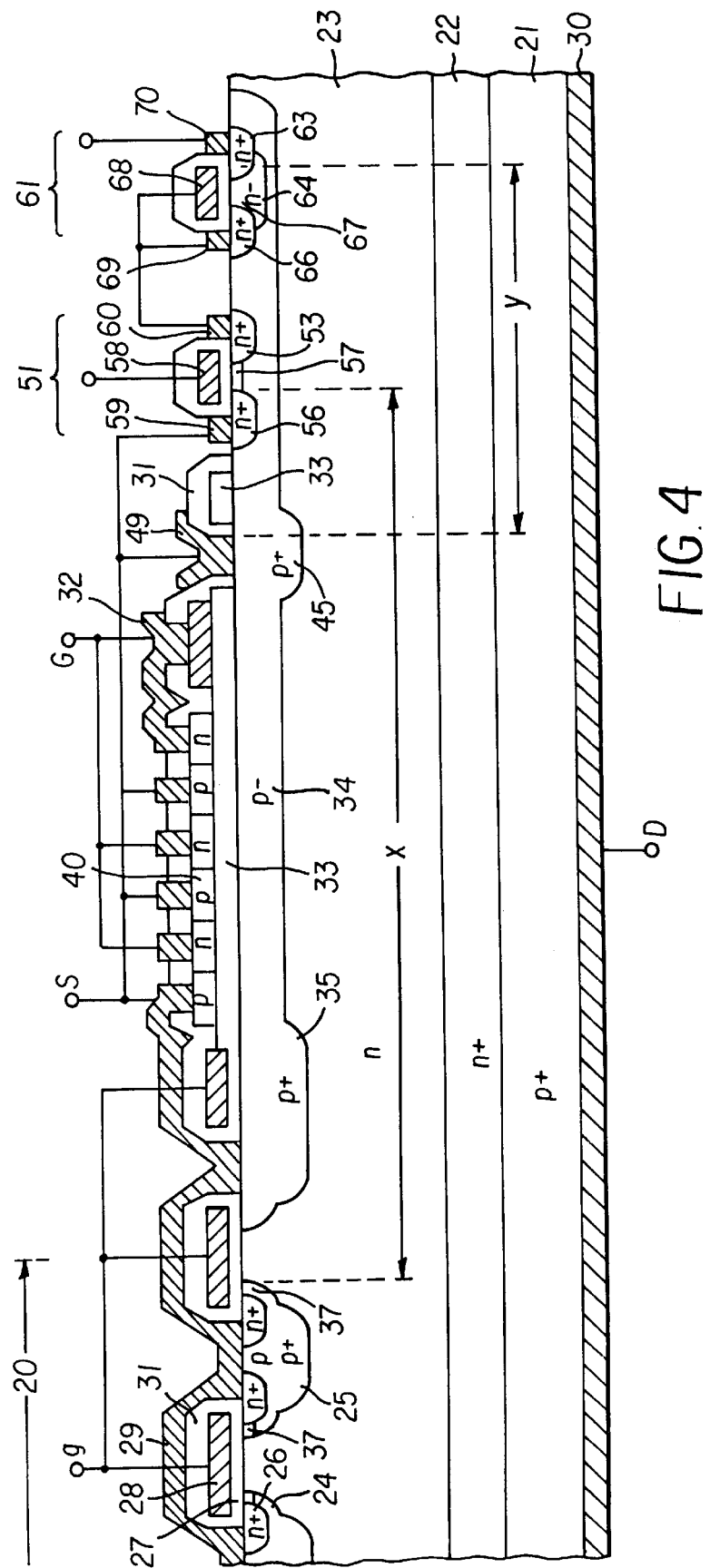
FIG. 4 is a cross-sectional view of a part of the intelligent IGBT of the first embodiment of FIG. 3.

FIG. 4 is a cross-sectional view of the intelligent IGBT thus produced, taken along line A—A of FIG. 3. Here, collector and emitter of the IGBT will be called drain and source, respectively, which are normally used when describing MOSFET. The left-side portion of FIG. 4 shows a main IGBT portion 20 that performs switching of main current. The structure of the main IGBT portion 20 is substantially identical with that of known IGBT. More specifically, mutually spaced p base regions 24 are formed in a surface layer of one of major surfaces of an n drift layer 2 having high resistivity, and $p^+$ well regions 25 having a higher impurity concentration and a larger diffusion depth than the p base regions 24 are formed as part of the p base regions 24, for the purpose of preventing latch-up of parasitic thyristor. An $n^+$ buffer layer 22 having lower resistance than the n drift layer 23 is formed on the other surface of the n drift layer 23, and a $p^+$ drain layer 21 is formed on the surface of the no buffer layer 22 remote from the n drift layer 23. Also, $n^+$ source regions 26 are formed in selected portions of surface layers of the p base regions 24. A gate electrode layer 28 made of polysilicon is formed on a gate oxide film 27 over surfaces of the p base regions 24 interposed between the $n^+$ source regions 26 and the n drift layer 23. In this manner, an n-channel type IGBT is produced. The surface of the gate electrode layer 28 is covered with an insulating film 31 formed of, for example, boron phosphorous silica glass (BPSG), on which a source electrode 29 is provided. Contact holes are formed through the insulating film 31 so that the source electrode 29 contacts with surfaces of both of the p base regions 24 and $n^+$ source regions 26, and so that a gate electrode 32 made of a metal contacts with the gate electrode layer 28 or its extension. A drain electrode 30 is formed on the surface of the $p^+$ drain layer 21 remote from the $n^+$ buffer layer 22. In many cases, the source electrode 29 extends over the gate electrode layer 28, with the insulating film 31 interposed therebetween, as shown in FIG. 4. S terminal and D terminal are connected to the source electrode 29 and the drain electrode 30, respectively.

The operation of the main IGBT portion 20 will be now described. When a positive voltage is applied to the gate electrode layer 28 while a voltage is being applied between the drain electrode 30 and the source electrode 29, an inversion channel is induced in an channel region 37 in a surface layer of each p base region 24 right under the gate electrode layer 28, and electrons are injected from the $n^+$ source region 26 into the n drift layer 23 through the inversion channel. In addition, holes are injected from the $p^+$ drain layer 21, so that the drain electrode 30 and the source electrode 29 are electrically connected to each other.

The central portion of FIG. 4 shows an arrangement for protecting the gate. More specifically, a $p^-$ well 34 is formed in a surface layer of the n drift layer 23, and the surface of the $p^-$ well 34 is covered with a thick field oxide film 33. Also, a Zener diode 40 is provided on the field oxide film 33. An electrode taken out from one end of the Zener diode 40 is connected to the source electrode 29, and an electrode taken out from the other end is connected to the gate electrode 32 to which a G terminal is connected. A $p^+$ isolation well 35 is provided in a peripheral portion of the main IGBT portion 20. On the right-hand side of the Zener diode 40, a lead electrode 49 to be connected to the source electrode 29 is formed in contact with the surface of the $p^+$ well 34. Also, a $p^+$ lead well 45 is formed below the lead electrode 49. The $p^+$ lead well 45 serves to reduce resistance due to contact with the lead electrode 49, and reduce resistance in the lateral direction of the $p^-$ well 34, and may be formed at the same time that the $p^+$ well regions 25 of the main IGBT portion 20 and the $p^+$ isolation well 35 are formed. As another test device, a MOS type semiconductor apparatus was fabricated wherein a Zener diode was formed in a surface layer of the n drift layer 23, instead of the Zener diode consisting of a polysilicon layer.

The right-side portion of FIG. 4 illustrates the internal control circuit 9 that is integrated on the intelligent IGBT. The internal control circuit 9 is similar to gate control means 50 as disclosed in U.S. Pat No. 5,621,601. Although not described in the present embodiment, this circuit uses a current detecting transistor and a current detecting resistance $R_d$ as disclosed in U.S. Pat. No. 5,621,601.

Figure 15:
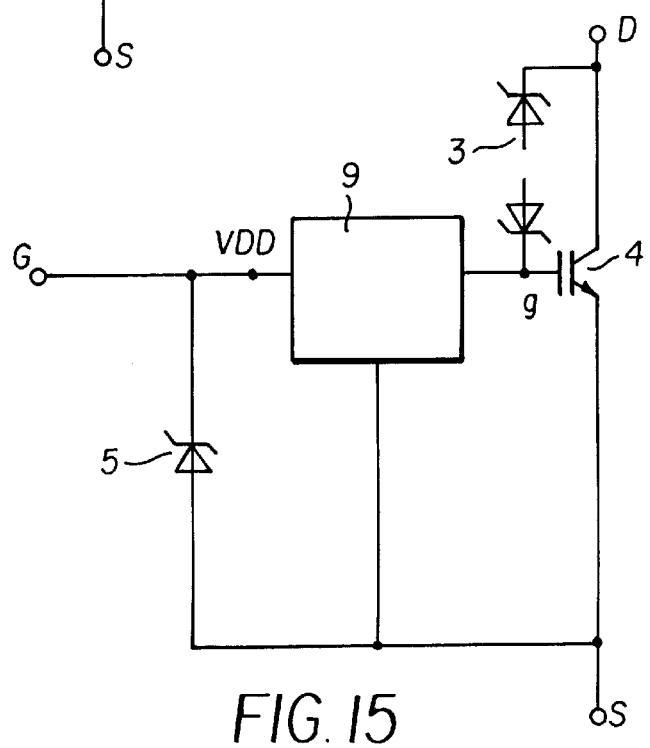
FIG. 15 is a circuit diagram showing an intelligent IGBT fabricated as a test device.
Figure 16A:
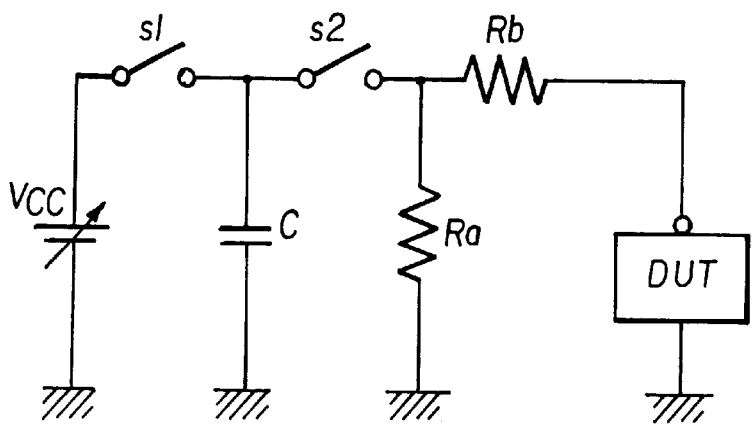
FIG. 16(a) is a view showing a circuit used for a surge voltage test.
Figure 16B:
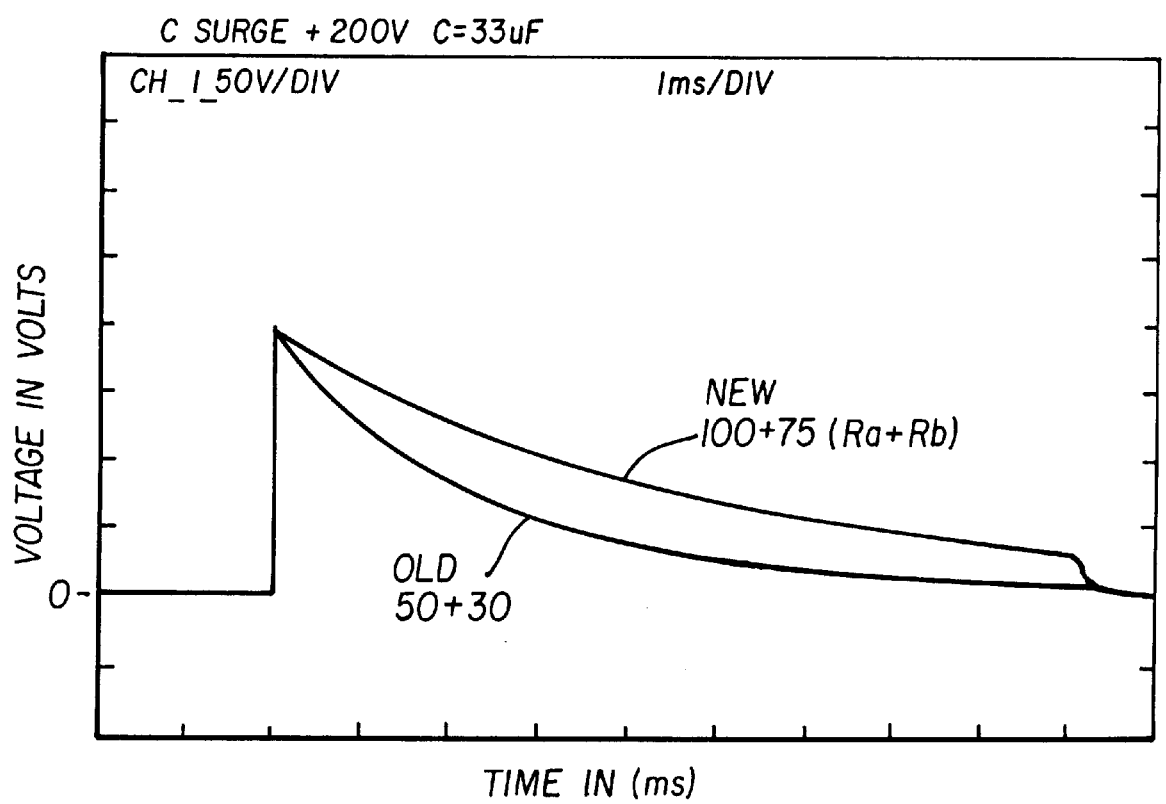
FIG. 16(b) is a graph showing voltage waveforms obtained in the surge voltage test.

An enhancement-type n channel MOSFET 51 and a depletion-type n channel MOSFET 61 are formed at a surface layer of the $p^-$ well 34 formed in the surface layer of the n drift layer 23. Reference numerals 53, 63 denote $n^+$ drain regions formed in the surface layer of the $p^-$ well 34, and drain electrodes 60, 70 are formed in contact with the surfaces of the $n^+$ drain regions 53, 63. Source electrodes 59, 69 are formed in contact with surfaces of $n^+$ source regions 56, 66. Reference numeral 64 denotes an n channel doped region for controlling the threshold voltage. Reference numerals 58, 68 denote gate electrode layers formed of polysilicon. The drain electrode 70 of the depletion-type n channel MOSFET 61 is connected to a power supply terminal ($V_{DD}$ and control input terminal G of FIG. 15). In the enhancement-type MOSFET 51, when a positive voltage is applied to the gate electrode 58, an inversion channel is induced in a channel region 57 located right below the gate electrode 58 between the $n^+$ source region 56 and the $n^+$ drain region 53, so that the source electrode 59, and the drain electrode 60 are electrically connected with each other. In the depletion-type MOSFET 61, when a negative voltage is applied to the gate electrode 68, an n⁻ depletion region 64 or channel region 67 located right below the gate electrode 68 between the n⁺ source region 66 and the n⁺ drain region 63 is depleted, so that the source electrode 69 and the drain electrode 70 are electrically disconnected from each other.

To produce a wafer used for experiments as described later, an n type layer (that provides the n⁺ buffer layer 22) having a resistivity of 0.4 0Ω·cm and a thickness of 30 μm is epitaxially grown on a p⁺ collector layer 21 having a resistivity of 0.01 Ω·cm and a thickness of 500 μm, and an n type layer (that provides the n⁻ drift layer 23) having a resistivity of 25 Ω·m and a thickness of 40 μm is laminated on the n⁺ buffer layer 22. The rest of the structure may be produced by almost the same process as used for producing known IGBT, except for some minor changes, such as different patterns of masks. The p base region 24, p⁻ well 34, p⁺ well 25, p⁺ isolation well 35, p⁺ lead well 45 and p region of the Zener diode are formed by implantation of boron ions and thermal diffusion, and the n⁺ source regions 26, 56, 66, n⁺ drain regions 53, 63 and n region of the Zener diode are formed by implantation of arsenic ions or phosphorous ions, and thermal diffusion. The p base regions 24 and n⁺ source regions 26 are formed by using the gate electrode layer 38 as part of masks, so that the edges of these regions 24, 26 are positioned as desired, and the widths of these regions 24, 26 are determined by lateral diffusion of the respective ions. The source electrodes 29, 59, 69, drain electrodes 60, 70, lead electrode 49, and the gate electrode 32 are formed by sputtering of Al alloy and subsequent photolithography, and the drain electrode 30 is formed by depositing three layers of Ti, Ni and Au by sputtering, so as to be soldered to a metallic substrate.

The dimensions of the respective regions and layers of the IGBT may be determined as follows; the diffusion depth of the p⁺ well 25, p⁺ isolation well 35, and the p⁺ lead well 45 is 6 μm, and the diffusion depth of the p base region 24 and the p⁻ well 34 is about 2 μm, while the diffusion depth of the n⁺ source regions 26, 56, 66 and the n⁺ drain regions 53, 63 is 0.4 μm. The thickness of the gate insulating film 27 is 25 μm, the thickness of the gate electrode layer 28 made of polysilicon is 1 μm, and the thickness of the source electrode 29 is about 3 μm. The Zener diode 40 has a Zener voltage of about 7V.

Experiment 1

Figure 5A:
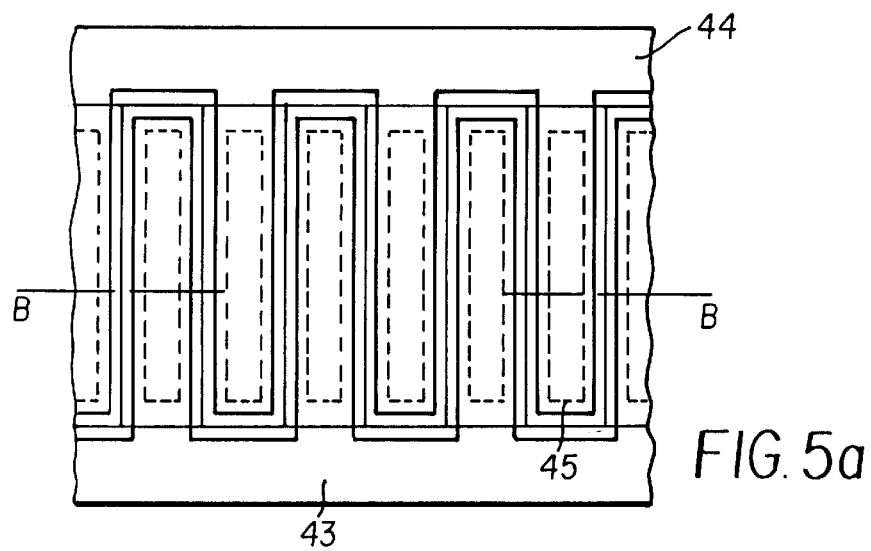
FIG. 5(a) is an enlarged view showing a Zener diode portion of an intelligent IGBT of the first embodiment of the present invention.
Figure 5B:
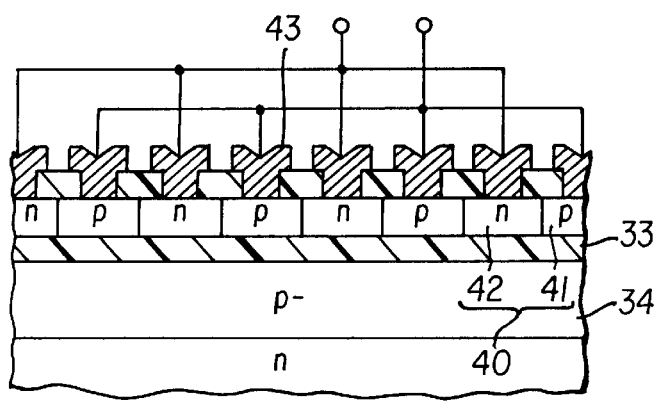
FIG. 5(b) is a cross-sectional view taken along line B—B of FIG. 5(a)

In the intelligent IGBT used in this experiment, the Zener diode 40 (Zp) uses a polysilicon layer formed by the same reduced-pressure CVD as employed for forming the gate electrode layer 29. In the experiment, the junction length of the Zener diode 40 was varied. In the process of the experiment, it was found that the Zener diode 40 does not necessarily consist of a single Zener diode, but may be provided by connecting a plurality of Zener diodes in parallel with each other, provided that the total value of the junction length is appropriately controlled. As a result of various analyses, the structure as shown in FIG. 5(a) and FIG. 5(b) was employed. FIG. 5(a) is a plan view of a part of the Zener diode portion, and FIG. 5(b) is a cross-sectional view taken along line B—B in FIG. 5(a). In FIG. 5(a), thin lines indicate the polysilicon layer and its pn junctions, dot lines indicate the position of windows formed through the insulating film, and thick lines indicate cathode electrode 44 and anode electrode 43 of the Zener diode. The polysilicon layer in which the conductivity type changes alternately from p to n or from n to p is covered with the insulating film, and, after contact holes are formed through the insulating film, comb-like electrodes are formed on the polysilicon layer. The polysilicon layer has a thickness of 1 μm and a width of 0.1 to 0.5 mm, and the width of each of the p anode region 41 and n cathode region 42 is about 15 mm.

Figure 6:
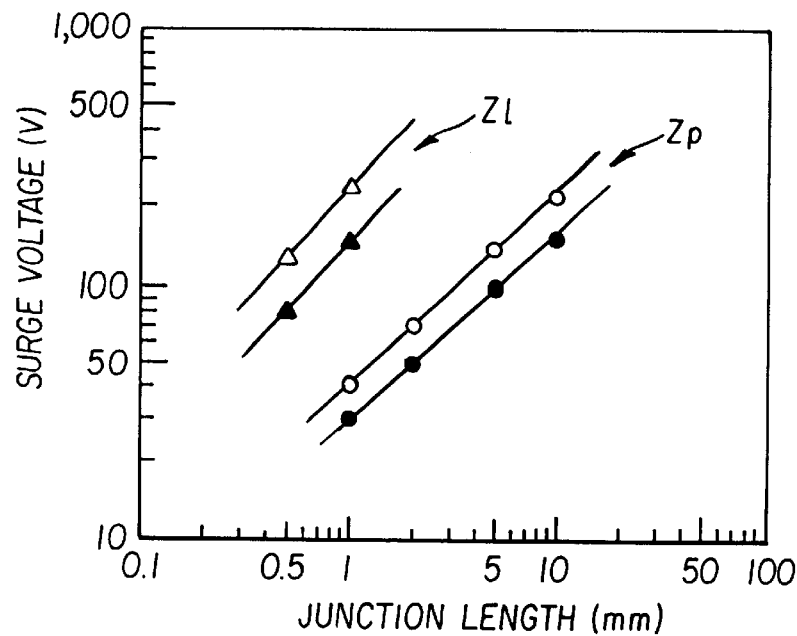
FIG. 6 is a graph showing the dependence of the surge voltage that can be sustained by the semiconductor apparatus, on the junction length of the diode.

FIG. 6 is a graph showing the dependence of the surge voltage that can be sustained by the IGBT, on the junction length, in which the horizontal axis indicates the junction length w of the Zener diode, and the vertical axis indicates the surge test voltage $V_{cc}$. In the graph of FIG. 6, ○ and ● indicate the maximum voltage at which the Zener diode did not break down at room temperature (25° C.) and a high temperature (150° C.), respectively.

The results of the test indicate that the surge voltage sustaining capability increases as the junction length increases. To achieve a sufficiently high capability to sustain or withstand the surge voltage, therefore, the junction length needs to be larger than each straight line passing each set of points ○ or ●. In order to enable the Zener diode to withstand a surge voltage of 150V or larger that normally occurs in practical use, it is found desirable to control the junction length to be 10 mim or greater. It is, however, useless and undesirable to excessively increase the junction length, and therefore the junction length is practically controlled to be 100 mm or less, more preferably, 70 mm or less.

Experiment 2

Figure 17:
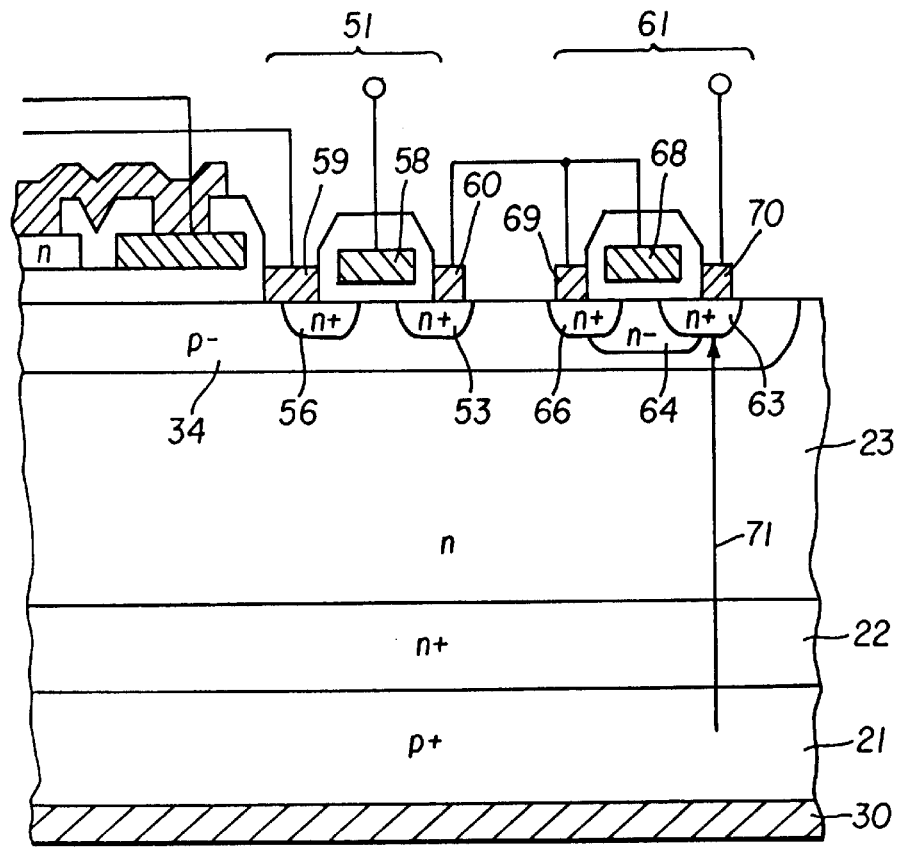
FIG. 17 is a cross-sectional view showing an internal control circuit portion of the intelligent IGBT fabricated as a test device.

In the process of Experiment 1 as described above, it was found that latch-up of the parasitic thyristor as shown in FIG. 17, which is another problem of known IGBT, is greatly influenced by the distance between the main IGBT portion and the MOSFETs of the internal control circuit. This may be because carriers (holes) moving during ON of the main IGBT portion enter the p⁻ well 34, and diffuse in the lateral direction, causing a potential difference that results in latch-up of the parasitic thyristor.

In order to evaluate the diffusion current from the main IGBT portion 20, a semiconductor apparatus including an IGBT cell was produced in which the IGBT cell was spaced a distance x (FIG. 4) away from the channel region 37 of the main IGBT portion 20, and the current flowing through the cell was measured.

Figure 18:
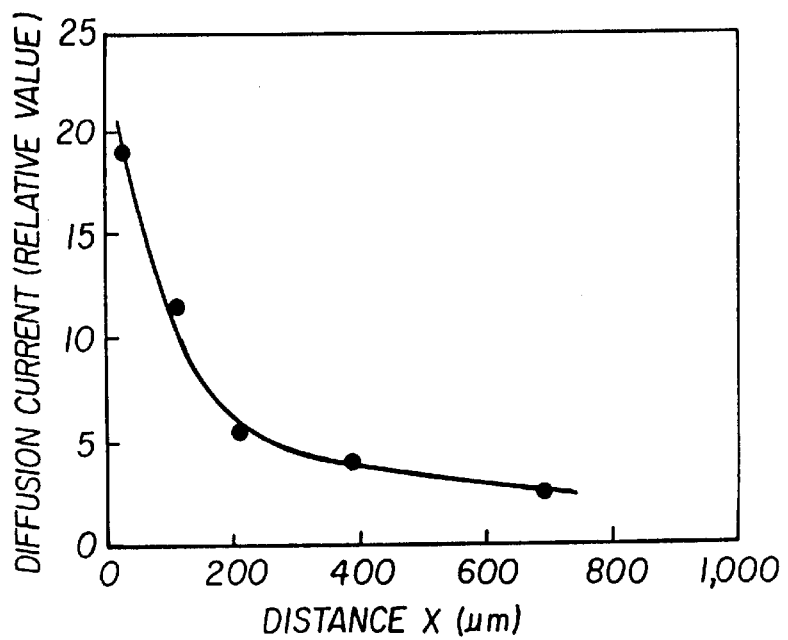
FIG. 18 is a graph showing the dependence of the diffusion current on the distance x.

Th FIG. 18 is a graph showing the dependence of the diffusion current on the distance x, in which the horizontal axis indicates the distance x as measured from the channel region 37 of the main IGBT portion 20, and the vertical axis indicates the diffusion current. Since the diffusion current depends upon the current of the main IGBT as well as the size of the cell, the scale of this current is arbitrarily selected in the graph.

As is understood from FIG. 18, the diffusion current decreases as the distance x increases. Namely, the latch-up of the parasitic thyristor can be effectively prevented by increasing the distance between the main IGBT portion 20 and the MOSFETs 51, 61 of the internal control circuit, more specifically, the distance between the channel region 37 of the main IGBT portion 20 and the channel regions 57, 67 of the MOSFETs 51, 61. It is, however, to be noted that the degree of reduction of the diffusion current is not uniform, namely, the diffusion current rapidly decreases until the distance x reaches 200 mm, and then slowly decreases. Accordingly, the distance by which the MOSFETs of the internal control circuit are spaced from the main IGBT portion is favorably controlled to be 200 μm or greater. Since the efficiency in the use of the semiconductor substrate is lowered if the distance x is excessively increased, the upper limit in practical use may be about 3 mm.

In the following experiments, 500 μm was selected as a design value for the distance x between the main IGBT portion 20 and the MOSFETs 51, 61 of the internal control circuit.

Experiment 3

Figure 19:
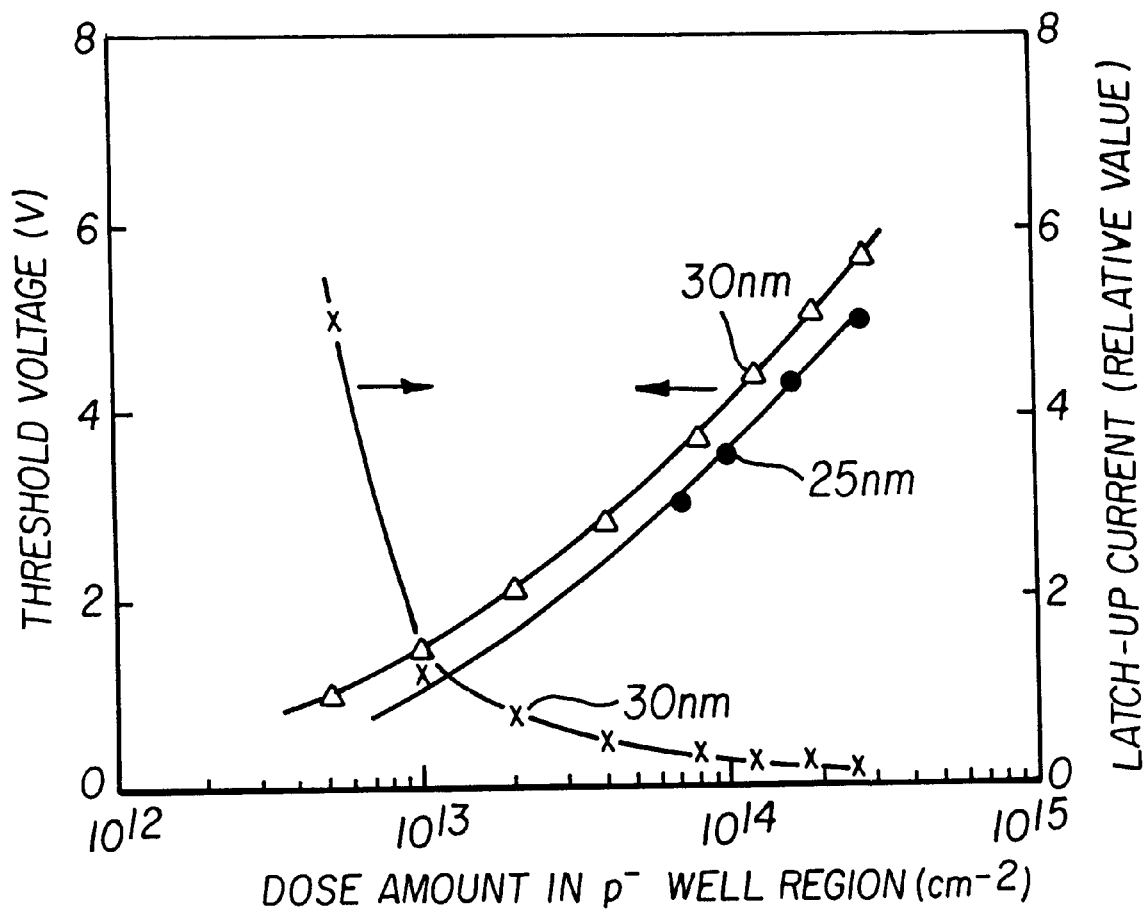
FIG. 19 is a graph showing the dependence of the latch-up current and the threshold voltage of the MOSFET of the internal control circuit on the amount of impurities in a $p^-$ well.

The latch-up of the parasitic thyristor also depends upon the amount of impurities in the p⁻ well 34. With the distance x between the main IGBT portion and the MOSFET of the internal control circuit being controlled to 500 μm based on the above result, some specimens of MOS semiconductor apparatus as follows were prepared in order to evaluate latch-up current. The amount of impurities in the p⁻ well 34 was varied among these specimens. In each specimen, an electrode was provided on the n⁺ source region 56 of the MOSFET, with a resistance connected in series with the electrode, and the current flowing through the resistance was measured when current flow from an inductive load is stopped. By using the resistance connected in series, the latch-up current can be evaluated in this manner, though no latch-up actually takes place. FIG. 19 is a graph showing the dependence of the latch-up current on the amount of impurities in the p⁻ well 34, in which file horizontal axis indicates the amount of boron ions implanted for forming the p⁻ well 34, and the vertical axis on the right side indicates the latch-up current. In this case, too, the scale of the latch-up current is arbitrarily selected.

As is understood from FIG. 19, the latch-up current is large if the amount of impurities in the p⁻ well 34 is small, and it decreases as the amount of impurities increases. Namely, the larger the amount of impurities in the p⁻ well 34, the more effectively latch-up can be prevented. It is, however, to be noted that the degree of decrease of the latch-up current is not uniform, namely, the latch-up current rapidly decreases until the impurity amount reaches $1 \times 10^{13}$ cm⁻³, and then slowly decreases. Accordingly, the amount of impurities in the p⁻ well 34 is favorably controlled to be equal to or greater than $1 \times 10^{13}$ cm⁻². The latch-up current is reduced because, if the amount of impurities in the p⁻ well 34 is increased, the base resistance of the npn transistor consisting of the n⁻drift layer 23, p⁻ well 34 and the n⁺ source region 56 is reduced, and thus the transistor is less likely to be turned on.

FIG. 19 also shows the dependence of the threshold voltage of the MOSFET of the internal control circuit on the impurity amount of the p⁻ well 34. In FIG. 19, the vertical axis on the left-hand side indicates the threshold voltage of the MOSFET of the internal control circuit, and the thickness of the gate oxide film is taken as a parameter, as indicated by "x", "Δ" and "●".

When the thickness of the gate oxide film is controlled to 30 nm, the threshold voltage is 1.5V if the impurity amount of the p⁻ well 34 is $1 \times 10^{13}$ cm⁻², but it increases to 4V or higher if the impurity amount is $1 \times 10^{14}$ cm⁻². Since the MOSFET of the internal control circuit is desired to be driven at an output level of a microcomputer with a 5-volt power supply, it becomes actually difficult to drive the MOSFET if the threshold voltage is 4V or higher. If the thickness of the gate oxide film is 25 nm, the threshold voltage is somewhat lower than that for the 30 nm-thickness gate oxide film, but it shows the same tendency as in the case where the thickness is 30 nm. Thus, the impurity amount of the p⁻ well 34 is desirably controlled to be not greater than $1.3 \times 10^{14}$ cm⁻² so that the threshold voltage becomes 4V or less.

In view of the above-described two factors, the impurity amount of the p well 34 is desirably controlled to be in the range of $1 \times 10^{13}$ to $1.3 \times 10^{14}$ cm⁻².

In the following experiments, $2 \times 10^{13}$ cm⁻² was chosen as a design value for the impurity amount of the p⁻ well 34.

Experiment 4

Moreover, it was found that the latch-up of the parasitic thyristor as shown in FIG. 17 upon turnoff is greatly influenced by the distance y (as indicated in FIG. 4) between the lead electrode 49 and the MOSFETs 51, 61 of the internal control circuit. In this case, too, as the distance y is reduced, the base resistance of an npn transistor consisting of the n⁻ drift layer 23, p⁻ well 34 and the n⁺ source region 56 is reduced, with a result of a reduced potential difference in the p⁻ well 34 right under the MOSFET 51, 61, whereby the npn transistor is less likely to be turned on.

Some specimens of semiconductor apparatuses including the MOSFET 51, 61 were fabricated among which the distance y from the lead electrode 49 (specifically, the distance from the electrode 49 to the n⁺ source regions 56, 66 or n⁺ drain regions 53, 63) was varied. Some of these specimens in which the distance y exceeded 100 μm experienced latch-up breakdown, but those in which the distance y was 80 μm or smaller did not break down. As the lower limit, the distance y may be 0 μm, because no problem occurred when the source electrode 59 of the MOSFET 51 was brought into contact with the p⁻ well 34.

Accordingly, the distance y from the lead electrode 49 is desirably controlled to be not greater than 100 μm. In the following, 30 μm was chosen as a design value for the distance y between the lead electrode 49 and the MOSFET 51, 61 of the internal control circuit.

First Embodiment

Based on the results of the experiments as described above, an intelligent IGBT was fabricated which incorporated the results of the experiments 2–4, and in which the junction length of the Zener diode made of polysilicon was as large as 40 nm.

This intelligent IGBT was able to withstand a surge voltage where the power supply voltage was ±300V, and thus found to be sufficiently operable in actual applications.

Figure 1A:
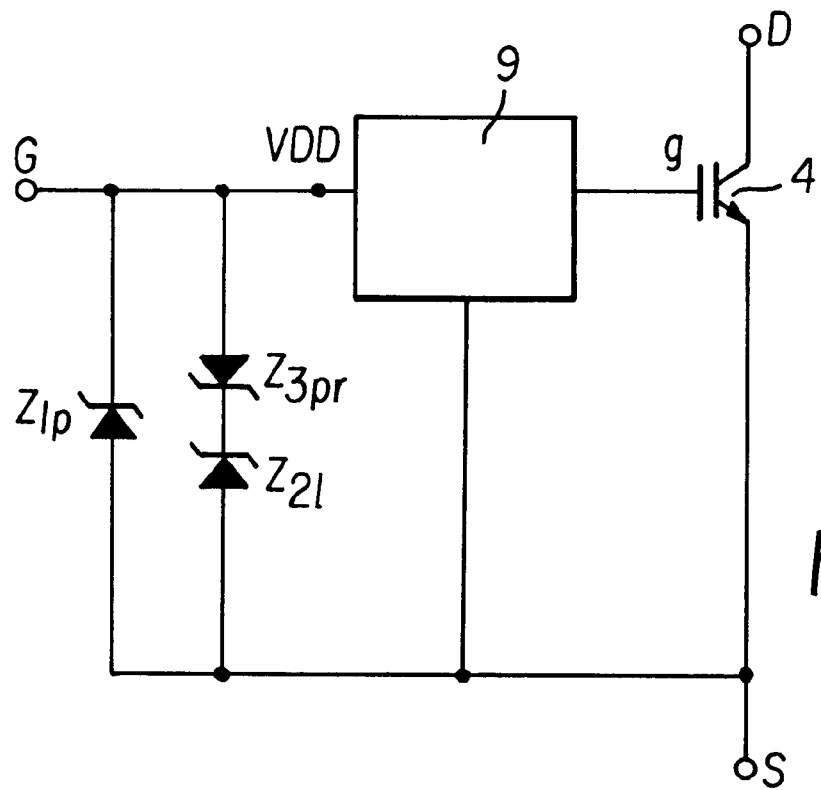
FIG. 1(a) is a circuit diagram showing an equivalent circuit of an intelligent IGBT according to the third embodiment of the present invention.
Figure 1B:
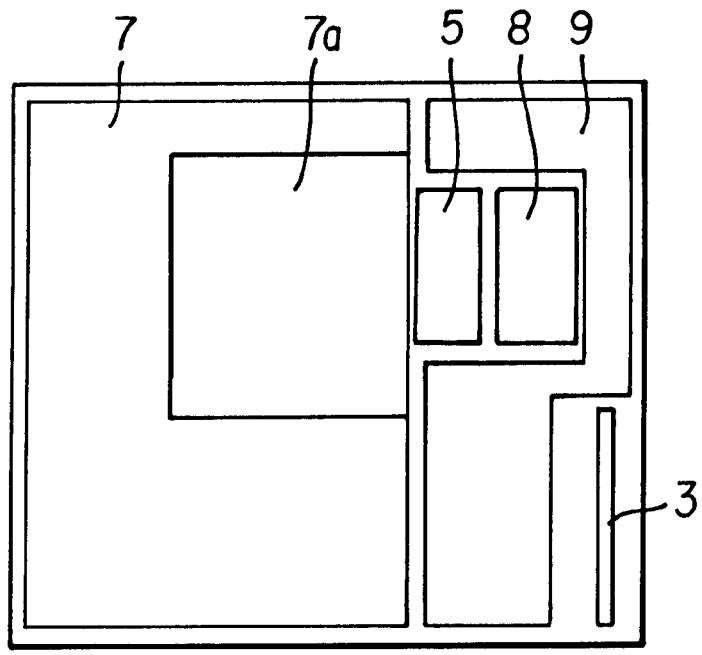
FIG. 1(b) is a plan view of the intelligent IGBI.

In particular, the Zener diode 5 was located between a source pad 7a and a gate pad 8 of the intelligent IGBT, as shown in FIG. 1(b), so that the anode electrode and cathode electrode of the Zener diode were integrated with the source pad 7a and gate pad 8, thus eliminating a need to draw wiring around. Consequently, the internal control circuit did not suffer from noise induced therein, and was able to perform stable operations.

Experiment 5

Figure 7A:
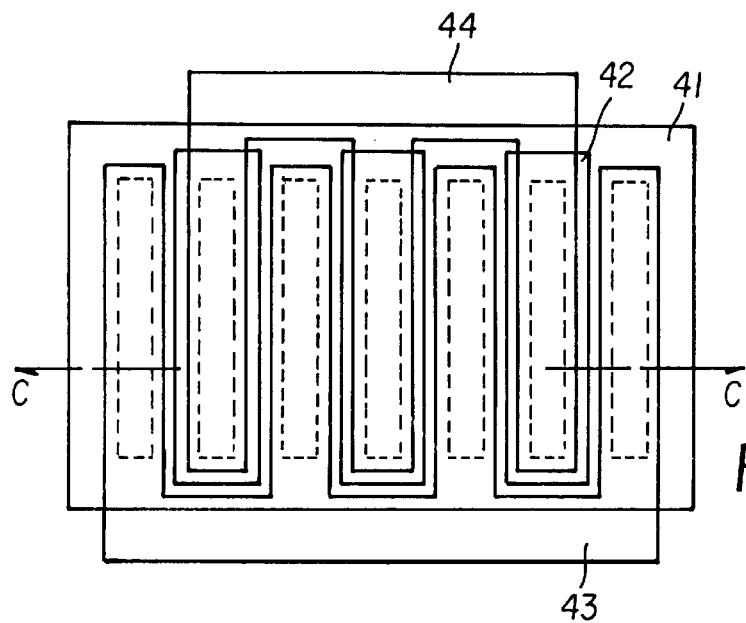
FIG. 7(a) is an enlarged view showing a Zener diode portion of an intelligent IGBT according to the second embodiment of the present invention.
Figure 7B:
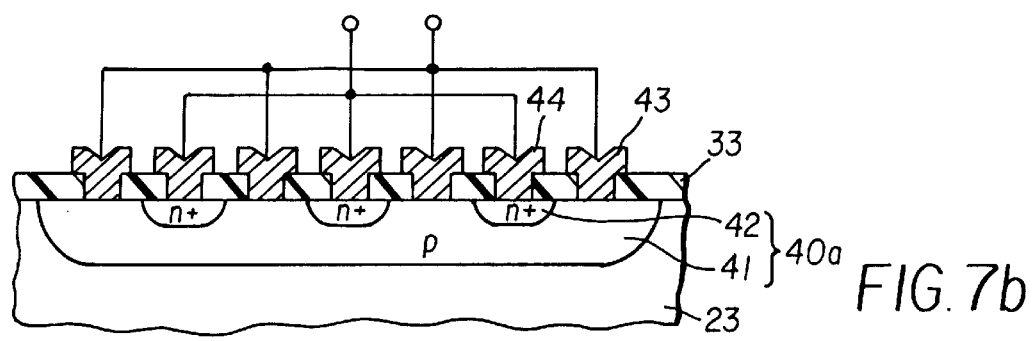
FIG. 7(b) is a cross-sectional view taken along line C—C of FIG. 7(a)

Next, an intelligent IGBT ($Z_1$) in which a Zener diode was formed in a surface layer of the n drift layer was fabricated, for use in an experiment in which the junction length of the Zener diode 40a was varied. FIG. 7(a) is a plan view showing a part of a Zener diode portion of the intelligent IGBT, and FIG. 7(b) is a cross-sectional view taken along line C—C of FIG. 7(a). In FIG. 7(a), thin lines define diffusion regions of the Zener diode, dot lines indicate the location of windows formed through the insulating film, and thick lines define the cathode electrode 44 and the anode electrode 43 of the Zener diode. A p anode region 41 was formed by implanting boron ions into the surface layer of the n drift layer and conducting heat treatment, and strip-like n cathode regions 42 were formed by implanting arsenic ions into selected areas of the p anode region 41 and conducting heat treatment. The dose amounts of the p anode region 41 and no cathode region 42 were $2 \times 10^{15}$ cm⁻² and $5 \times 10^{15}$ cm⁻², and the diffusion depths of these regions 41, 42 were 6 μm and 0.5 μm, respectively. In addition, comb-like anode electrode 43 and cathode electrode 44 were provided, so as to produce a Zener diode having a Zener voltage of about 4V.

In this case, too, the Zener diode 40a does not necessarily consist of a single Zener diode, but may be provided by connecting a plurality of Zener diodes in parallel with each other, provided that the total value of the junction length is appropriately controlled.

FIG. 6 is a graph showing the dependence of the surge voltage the intelligent IGBT is able to withstand, on the junction length, and the results are indicated by dot lines. In this graph, Δ and ▲ indicate the maximum voltage at which the Zener diode did not break down at room temperature (25° C.) and a high temperature (150° C.), respectively.

The results of the test indicate that the surge voltage sustaining capability increases as the junction length increases. To achieve a sufficiently high capability to sustain or withstand the surge voltage, therefore, the junction length needs to be larger than each straight line passing each set of points Δ and ▲. In order to enable the Zener diode to withstand a surge voltage of 150V or larger that normally occurs in practical use, it is found desirable to control the junction length to be 1.0 mm or greater. In actual applications, it is desirable to control the junction length to be 10 mm or less, more preferably, 5 mm or less.

If the Zener diode is formed in the semiconductor substrate, the junction length may be only one-tenth of that of the Zener diode of the first embodiment using the polysilicon layer. This is because the semiconductor substrate formed of a single crystal exhibits a high degree of crystallinity, and has a good ability to dissipate heat.

Second Embodiment

Based on the results of the experiments as described above, an intelligent IGBT was fabricated which incorporated the results of the experiments 2–4, and in which the junction length of the Zener diode formed in the semiconductor substrate was as large as 3 mm. Even though the area of the Zener diode was reduced to be about one-eighth of that of the first embodiment, the intelligent IGBT of the present embodiment was able to withstand a surge voltage where the power supply voltage was ±300V, and thus found to be sufficiently operable in actual applications. Furthermore, the area of its cell portion could be increased to such an extent to which the area of the Zener diode was reduced.

In particular, the Zener diode was located between a source pad and a gate pad of the intelligent IGBT, as shown in FIG. 1(b), so that the anode electrode and cathode electrode of the Zener diode were integrated with the source pad and gate pad, thus eliminating a need to draw wiring around. Consequently, the internal control circuit did not suffer from noise induced therein due to wiring, and was able to perform stable operations.

Third Embodiment

If the Zener diode is formed in the semiconductor substrate, the area of the Zener diode can be significantly reduced. In the IGBT, for example, in which the p+ drain layer is located below the n drift layer, these n drift and p+ drain layers cooperate with the p anode region and n+ cathode region of the Zener diode to provide a four-layer structure, which gives rise to a parasitic thyristor and causes a problem of latch-up of the parasitic thyristor.

A solution to this problem was considered. FIG. 1(a) is a circuit diagram showing an equivalent circuit of a MOS type semiconductor device according to the third embodiment of tile present invention. In this circuit, a Zener diode $Z_{1p}$ consisting of a polysilicon layer is connected between the gate G and the source S, and a Zener diode $Z_{21}$ formed in the semiconductor substrate and a Zener diode $Z_{3pr}$ consisting of a polysilicon layer and oriented in the reverse direction were connected in parallel with the Zener diode $Z_{1p}$. A series Zener diode array between the gate g of the output-stage IGBT 4 and the drain D is not illustrated in FIG. 1(a).

Here, it is important that the sum of the breakdown voltage of the Zener diode $Z_{21}$ formed in the semiconductor substrate and the forward voltage of the backward Zener diode $Z_{3pr}$ in the form of a polysilicon layer is made equal to or smaller than the breakdown voltage of the Zener diode $Z_{1p}$ in the form of a polysilicon layer. In the present embodiment, the breakdown voltage of the Zener diode $Z_{1p}$ is 7V, and the breakdown voltage of the Zener diode $Z_{21}$ is about 4V. In this case, when a surge voltage is applied to the gate G, the surge current flows toward the diodes $Z_{21}$ and $Z_{3pr}$. Accordingly, the Zener diode used for protection in this embodiment requires a smaller area than the Zener diode of polysilicon, as in the second embodiment, and is still able to withstand a large surge voltage.

Further, since the backward Zener diode $Z_{3pr}$ consisting of a polysilicon layer is connected in series with the Zener diode $Z_{21}$ formed in the semiconductor substrate, no parasitic thyristor appears in the Zener diode portion, which is thus free from the problem of latch-up.

FIG. 1(b) is a plan view showing the MOS type semiconductor apparatus of the third embodiment of the present invention, which includes a source electrode 7 of the IGBT, internal control circuit 9, and Zener diode 5. In this embodiment, the area of the Zener diode 5 is about one-third of that of the semiconductor apparatus of FIG. 3.

Figure 2A:
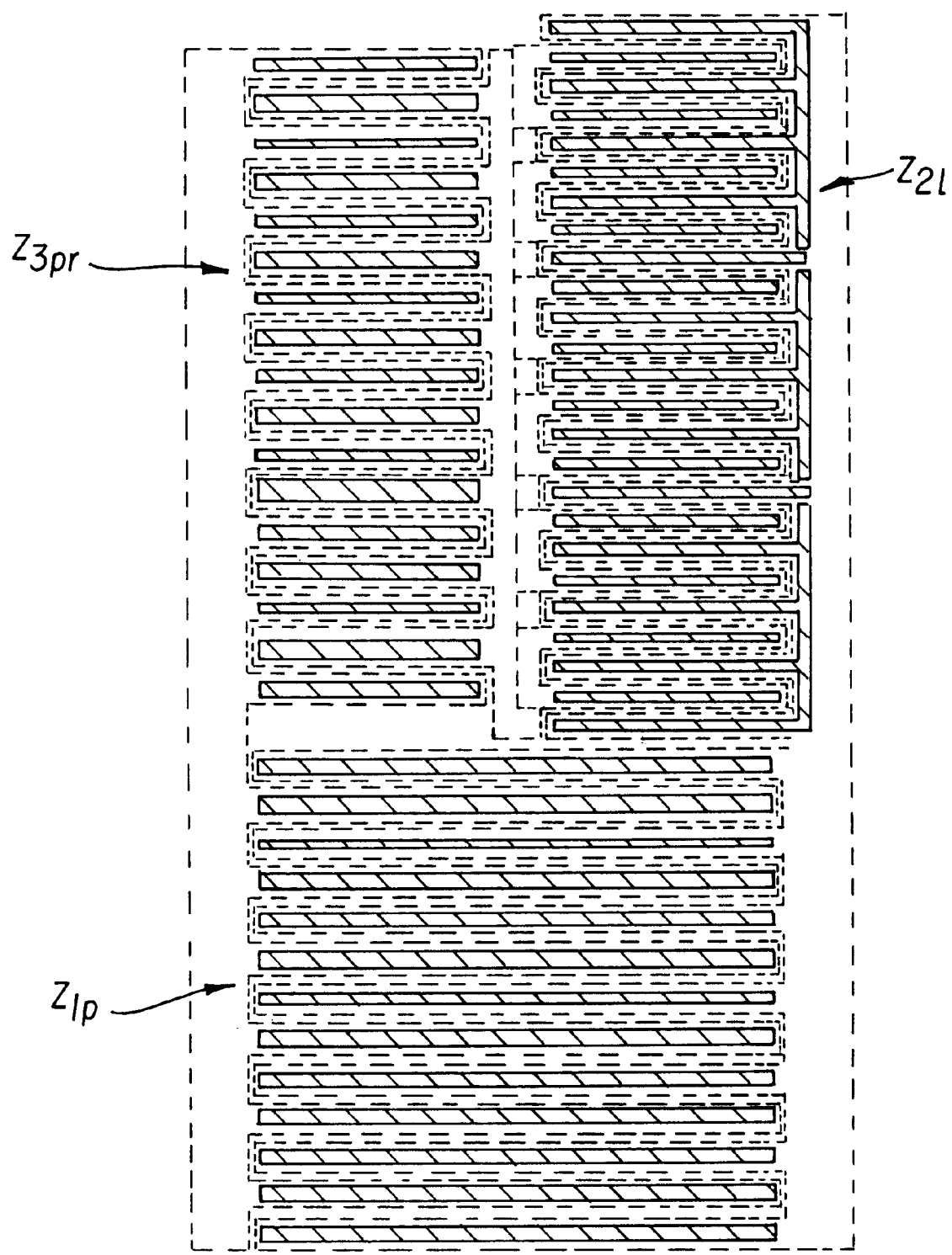
FIG. 2(a) is an enlarged view of a Zener diode portion of an intelligent IGBT of the third embodiment of the invention.
Figure 2B:
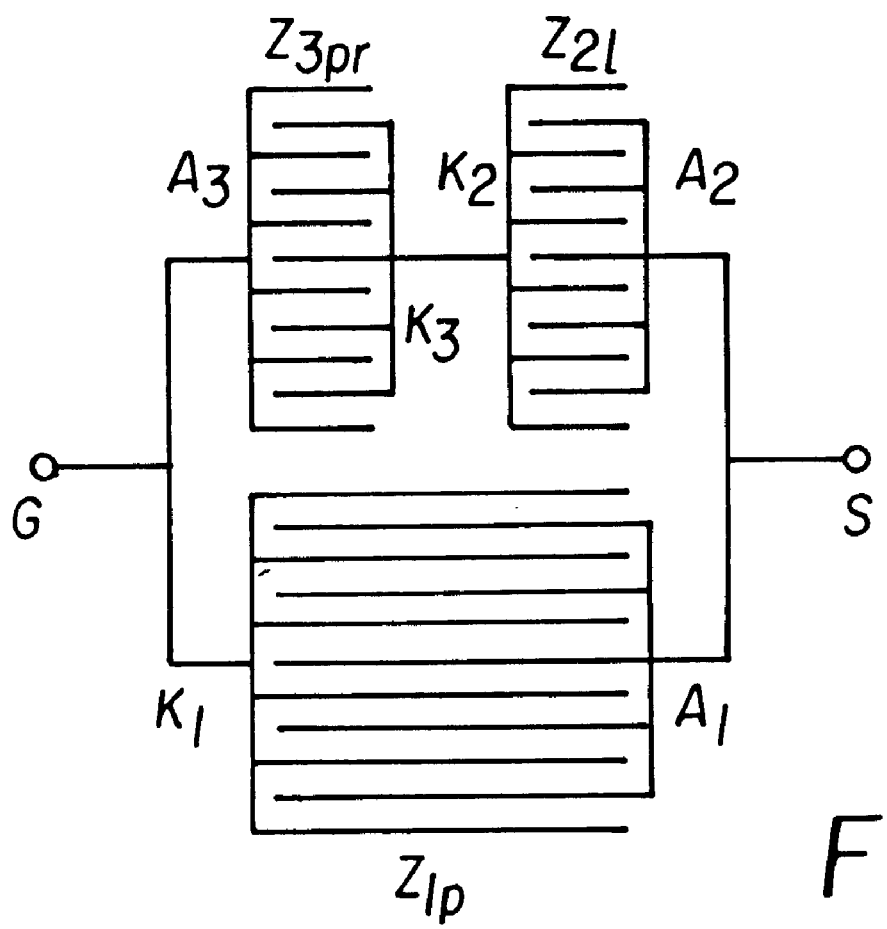
FIG. 2(b) is a view showing the arrangement of electrodes of the Zener diode portion.

FIG. 2(a) is an enlarged view showing the Zener diode portion 5 of the MOS type semiconductor apparatus of the third embodiment of FIG. 1(b). As shown in FIG. 2(a), the Zener diode $Z_{1p}$ formed of polysilicon takes up about one half of the Zener diode portion 5, and the Zener diode $Z_{21}$ is formed in about one-forth of the entire area of the semiconductor substrate in this portion 5, while the backward Zener diode $Z_{3pr}$ consisting of the polysilicon layer takes up about one-forth of the Zener diode portion 5. The junction lengths of the Zener diodes $Z_{1p}$, $Z_{21}$, $Z_{3pr}$ are 4 mm, 3 mm, and 3 mm, respectively. FIG. 2(b) shows the connecting arrangement of the electrodes of the respective Zener diodes $Z_{1p}$, $Z_{21}$ and $Z_{3pr}$ of FIG. 2(a).

Each Zener diode has comb-like anode and cathode electrodes. The cathode electrode $K_1$ of the, Zener diode $Z_{1p}$ is connected to the anode electrode $A_3$ of the Zener diode $Z_{3pr}$, and the anode electrode $A_1$ of the Zener diode $Z_{1p}$ is connected to the anode electrode $A_2$ of the Zener diode $Z_{21}$, while the cathode electrode $K_2$ of the Zener diode $Z_{21}$ is connected to the cathode electrode $K_3$ of the Zener diode $Z_{3pr}$.

In this embodiment, too, the Zener diode is located between the source pad and the gate pad of the intelligent IGBT, and therefore the anode electrode and cathode electrode of the Zener diode can be integrated with the source pad and gate pad, respectively, thus eliminating a need to draw wiring around. Consequently, the intelligent IGBT does not suffer from noise induced in the internal control circuit, and is able to perform stable operations, assuring satisfactory dynamic characteristics.

Fourth Embodiment

Figure 8:
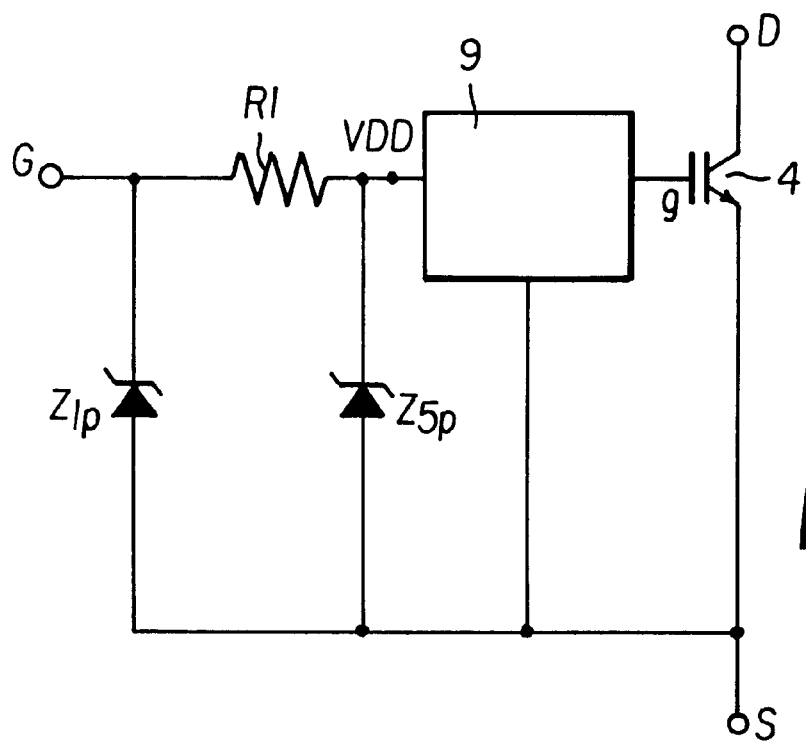
FIG. 8 is a circuit diagram showing an equivalent circuit of an intelligent IGBT according to the fourth embodiment of the present invention.

FIG. 8 is a circuit diagram showing an equivalent circuit of a protective Zener diode portion of a MOS type semiconductor apparatus according to the fourth embodiment of the present invention.

In this embodiment, a Zener diode $Z_{1p}$ that consists of a polysilicon layer is connected between the gate G and the source S, so as to protect the device from surge voltage. The junction length of the Zener diode $Z_{1p}$ is preferably 10 mm or larger, as in the first embodiment. Further, a resistance $R_1$ and a Zener diode $Z_{5p}$ are connected between the gate G and the source S, and a point between the resistance $R_1$ and the Zener diode $Z_{5p}$ is connected to a power supply terminal $V_{DD}$ of the internal control circuit 9 of the IGBT 4. A series Zener diode array provided between the gate g of the IGBT 4 of the output stage and the drain D is not illustrated in FIG. 8.

The breakdown voltage of the Zener diode $Z_{5p}$ is made equal to or smaller than that of the Zener diode $Z_{1p}$. In the present embodiment, the breakdown voltage of both of the Zener diodes $Z_{1p}$ and $Z_{5p}$ is 7V, and the resistance $R_1$ is 150Ω.

With this arrangement, when a surge voltage that is positive on the side of the gate G is applied between the gate G and the source S, the voltage is clamped to the breakdown voltage of the Zener diode $Z_{1p}$. The clamp voltage is then applied across the resistance $R_1$ and the Zener diode $Z_{5p}$. As a result, the breakdown voltage of the Zener diode $Z_{5p}$ is applied to the power supply terminal $V_{DD}$ of the internal control circuit 9 of the intelligent IGBT. Thus, the voltage applied to the power supply terminal $V_{DD}$ is lower than the breakdown voltage of the Zener diode $Z_{1p}$ by an amount corresponding to a voltage drop across the resistance $R_1$.

Even where the breakdown voltage of the Zener diode $Z_{5p}$ is equal to that of the Zener voltage $Z_{1p}$, the voltage that is clamped by the Zener diode $Z_{1p}$ is significantly larger than the breakdown voltage of the Zener diode $Z_{5p}$ because of the operating resistance. Namely, the voltage applied to the power supply terminal $V_{DD}$ of the internal control circuit, which is obtained by subtracting the amount of the voltage drop across the resistance R. from the clamp voltage, is approximately equal to the breakdown voltage of the Zener diode $Z_{5p}$. Thus, the voltage applied to the power supply terminal $V_{DD}$ is significantly lowered as compared to the voltage applied between the gate G and the source S. With this arrangement, the intelligent IGBT exhibits an improved capability to withstand surge voltage, and the influence of the surge voltage on the internal control circuit can be reduced.

When a surge voltage that is positive on the side of the source S is applied between the gate G and the source S, the voltage is clamped to the forward voltage of the Zener diode $Z_{1p}$. The clamp voltage is then applied across the resistance $R_1$ and the Zener diode $Z_{5p}$. Thus, the forward voltage of the Zener diode $Z_{5p}$, which is smaller than the forward voltage of the Zener diode $Z_{1p}$ by an amount corresponding to a voltage drop across the resistance $R_1$, is applied to the power supply terminal $V_{DD}$ of the internal control circuit of the intelligent IGBT.

When a surge voltage that is positive on the side of the source S is applied between the gate G and the source S, breakdown is likely to occur because of latch-up of a parasitic thyristor that appears in the internal control circuit, as described before, In the intelligent IGBT of the fourth embodiment, however, the voltage that has been reduced by the amount of voltage drop across the resistance $R_1$ is applied to the power supply terminal $V_{DD}$, and therefore the breakdown due to the latch-up can be prevented.

In particular, if the Zener diode $Z_{5p}$ and the resistance $R_1$ are formed from polysilicon layers, it is possible to avoid a problem of a parasitic thyristor that would appear in the Zener diode portion in the case where the Zener diode is formed in the semiconductor substrate, thus enabling the intelligent IGBT to operate with improved reliability.

Fifth Embodiment

Figure 9:
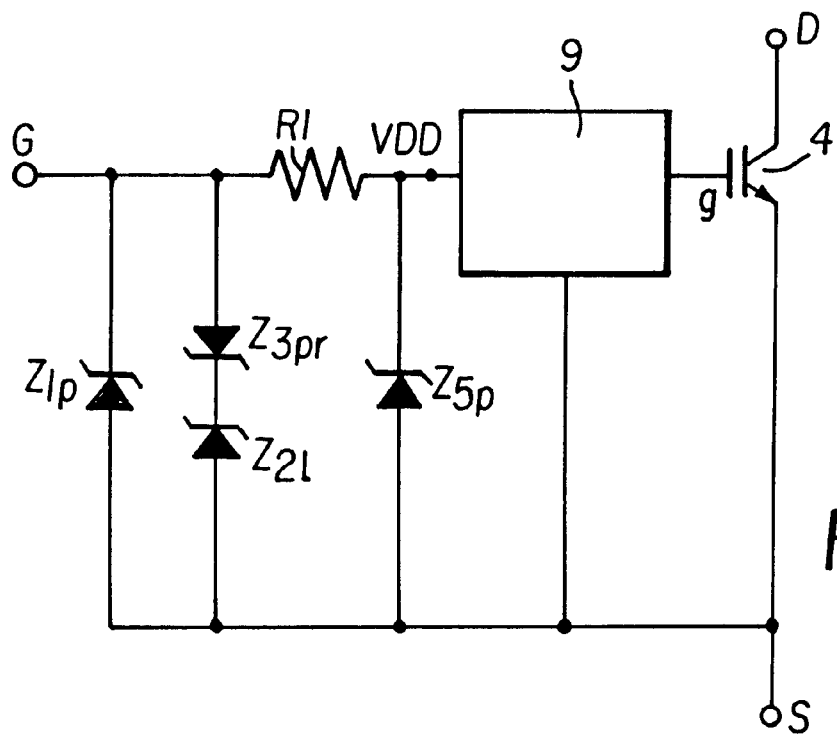
FIG. 9 is a circuit diagram showing an equivalent circuit of an intelligent IGBT according to the fifth embodiment of the present invention.

FIG. 9 is a circuit diagram showing an equivalent circuit of a protective Zener diode portion of a MOS type semiconductor apparatus according to the fifth embodiment of the present invention. This embodiment is an improvement of the fourth embodiment of FIG. 8.

Similarly to the third embodiment of FIG. 1(*a*), a Zener diode $Z_{1p}$ that consists of a polysilicon layer is connected between the gate G and the source S, and a Zener diode $Z_{21}$ formed in the semiconductor substrate and a Zener diode $Z_{3pr}$ that consists of a polysilicon layer and is reversely oriented with respect to the Zener diode $Z_{21}$ are connected in parallel with the Zener diode $Z_{1p}$. In addition, a resistance $R_1$ and a Zener diode $Z_{5p}$ are connected between the gate G and the source S, and a point between the resistance $R_1$ and the Zener diode $Z_{5p}$ is connected to the power supply terminal $V_{DD}$ of the internal control circuit 9. The breakdown voltage of the Zener diode $Z_{5p}$ is made smaller than the sum of the breakdown voltage of the Zener diode $Z_{21}$ and the forward voltage of the Zener diode $Z_{3pr}$. The junction length of the Zener diode $Z_{21}$ is preferably controlled to 1 mm or greater, as in the second embodiment.

With this arrangement, when a surge voltage that is positive on the side of the gate G is applied between the gate G and the source S, the voltage is clamped to the sum of the breakdown voltage of the Zener diode $Z_{21}$, formed in the semiconductor substrate and the forward voltage of the backward Zener diode $Z_{3pr}$ consisting of the polysilicon layer, and the clamp voltage is applied across the resistance $R_1$ and the Zener diode $Z_{5p}$. As a result, the breakdown voltage of the Zener diode $Z_{5p}$ is applied to the power supply terminal $V_{DD}$ of the internal control circuit of the intelligent IGBT. Thus, the voltage applied to the power supply terminal $V_{DD}$ is lower than the clamp voltage by all amount corresponding to a voltage drop across the resistance $R_1$.

When a surge voltage that is positive on the side of the source S is applied between the gate G and the source S, the forward voltage of the Zener diode $Z_{5p}$, which is smaller than the forward voltage of the Zener diode $Z_{1p}$ by an amount of a voltage drop across the resistance $R_1$, is applied to the internal control circuit of the intelligent IGBT.

In the fifth embodiment, too, since the voltage that has been reduced by the amount of voltage drop across the resistance $R_1$ is applied to the power supply terminal $V_{DD}$ of the internal control circuit, the internal control circuit portion is prevented from breaking down due to latch-up of a parasitic thyristor formed therein.

In particular, if the Zener diode $Z_{5p}$ and the resistor $R_1$ are formed from polysilicon layers, the above-described problem of a parasitic thyristor in the Zener diode portion can be avoided.

Sixth Embodiment

Figure 10:
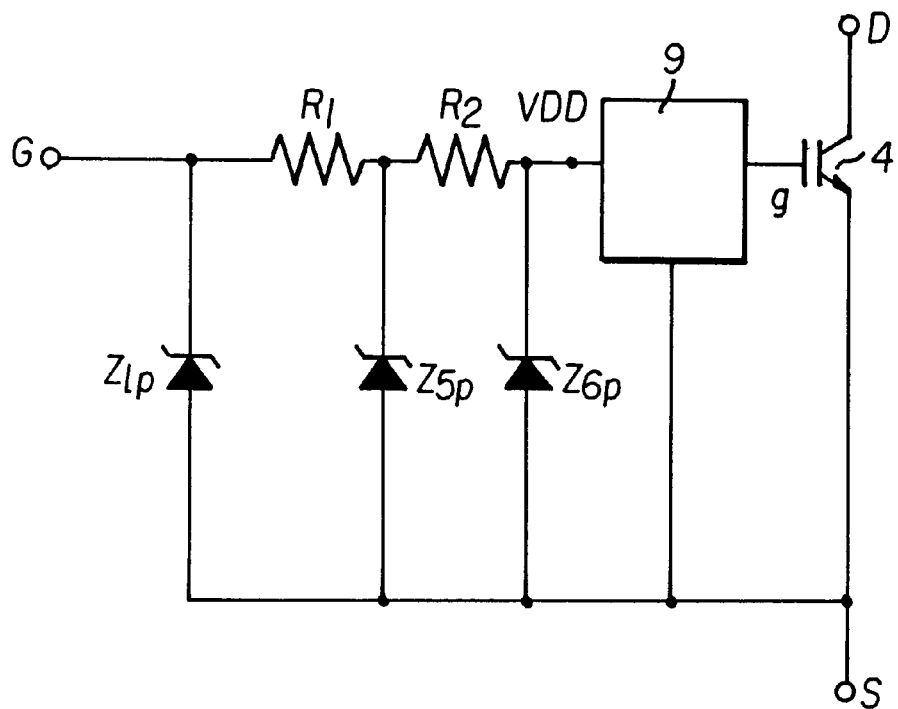
FIG. 10 is a circuit diagram showing an equivalent circuit of an intelligent IGBT according to the sixth embodiment of the present invention.

FIG. 10 is a circuit diagram showing an equivalent circuit of a protective Zener diode portion of a MOS type semiconductor apparatus according to the sixth embodiment of the present invention. This embodiment is another improvement of the fourth embodiment of FIG. 8.

In addition of the arrangement of the fourth embodiment of FIG. 8, a resistance $R_2$ and a Zener diode $Z_{6p}$ are connected on the side of the control input (g) of the IGBT. The breakdown voltage of the Zener diode $Z_{6p}$ is made equal to or smaller than that of the Zener diode $Z_{5p}$.

With this arrangement, when a surge voltage that is positive on the side of the gate G is applied between the gate G and the source S, the surge voltage is clamped to the breakdown voltage of the Zener diode $Z_{1p}$ consisting of a polysilicon layer, and the clamp voltage is applied across the resistance $R_1$ and the Zener diode $Z_{5p}$. Further, the breakdown voltage of the Zener diode $Z_{5p}$ is applied across the resistance $R_2$ and Zener diode $Z_{6p}$. As a result, the breakdown voltage of the Zener diode $Z_{6p}$ is applied to the power supply terminal $V_{DD}$ of the internal control circuit of the intelligent IGBT. Thus, the voltage applied to the power supply terminal $V_{DD}$ is further reduced by an amount of a voltage drop across the resistance $R_2$, as compared with the voltage applied to the power supply voltage $V_{DD}$ in the fourth embodiment.

When a surge voltage that is positive on the side of the source S is applied between the gate G and the source S, the forward voltage of the Zener diode $Z_{5p}$ becomes smaller than the forward voltage of the Zener diode $Z_{1p}$ by an amount corresponding to a voltage drop across the resistance $R_1$, and the forward voltage of the Zener diode $Z_{6p}$ becomes smaller than the forward voltage of the Zener diode $Z_{5p}$ by an amount corresponding to a voltage drop across the resistance $R_2$. As a result, the forward voltage of the Zener diode $Z_{6p}$ is applied to the power supply terminal $V_{DD}$ of the internal control circuit of the intelligent IGBT. For example, when the forward voltage of the Zener diode $Z_{1p}$ is 2V, the forward voltage of the Zener diode $Z_{5p}$ is 1V, and the forward voltage of the Zener diode $Z_{6p}$ is 0.6V. In the intelligent IGBT of the sixth embodiment, therefore, the voltage applied to the power supply terminal $V_{DD}$ is further reduced by the amount of the voltage drop across the resistance $R_2$ as compared with that of the fourth embodiment, and latch-up of a parasitic thyristor in the internal control circuit can be prevented. In this manner, the influence of the surge voltage on the internal control circuit can be further reduced, as compared with the previous embodiments of FIG. 8 and FIG. 9.

If the Zener diodes $Z_{5p}$, $Z_{6p}$ and the resistances $R_1$, $R_2$ are formed from polysilicon layers, it is possible to avoid the problem of a parasitic thyristor in the Zener diode portion, as in the previous embodiments.

It will be easily understood that the above-described technique may be utilized to expand the Zener diode portion to a multistage arrangement including additional Zener diodes $Z_{7p}$, $Z_{8p}$, ••• and additional resistors $R_3$, $R_4$, •••.

Seventh Embodiment

Figure 11:
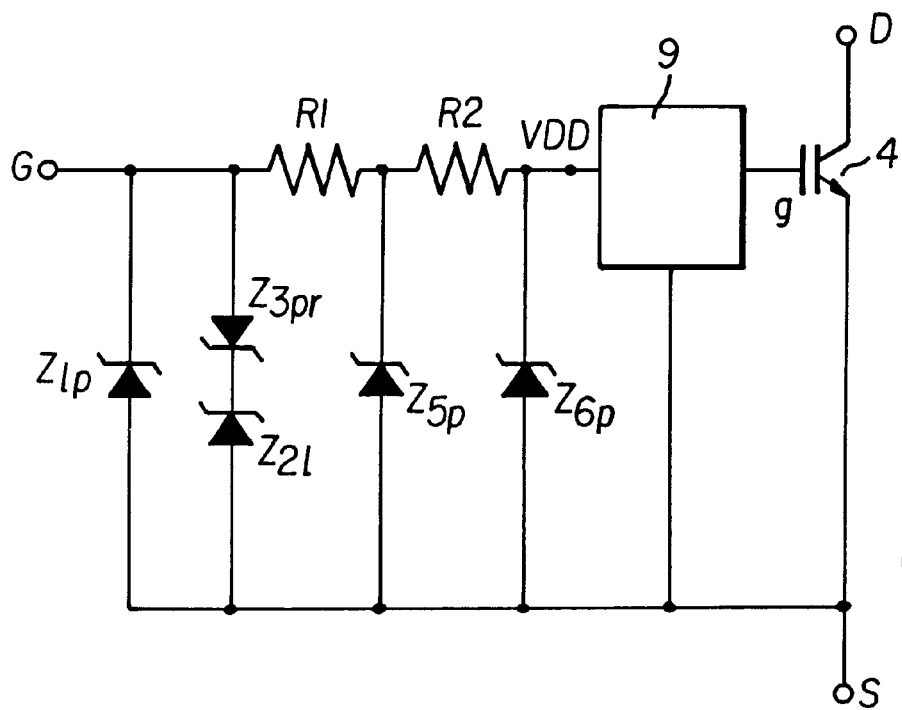
FIG. 11 is a circuit diagram showing an equivalent circuit of an intelligent IGBT according to the seventh embodiment of the present invention.

FIG. 11 is a circuit diagram showing an equivalent circuit of a protective Zener diode portion of a MOS type semiconductor apparatus according to the seventh embodiment of the present invention. This embodiment is obtained by improving the fifth embodiment of FIG. 9 in the same manner as in the sixth embodiment.

In comparison with the circuit arrangement of the fifth embodiment of FIG. 9, a resistance $R_2$ and a Zener diode $Z_{6p}$ are additionally connected to the control input side of the IGBT. The breakdown voltage of the Zener diode $Z_{6p}$ is made equal to or smaller than that of the Zener diode $Z_{5p}$.

With this arrangement, the area of the protective Zener diode portion can be reduced as in the fifth embodiment, and the problem of latch-up of a parasitic thyristor in this portion can be avoided. Further, a similar effect as obtained in the sixth embodiment may be provided.

When a surge voltage that is positive on the side of the gate G is applied between the gate G and the source S, the voltage that is clamped by the sum of the forward voltage of the Zener diode $Z_{21}$ formed in the semiconductor substrate and the forward voltage of the reverse-oriented Zener diode $Z_{3pr}$ consisting of a polysilicon layer is applied across the resistance $R_1$ and the Zener diode $Z_{5p}$, and the breakdown voltage of the Zener diode $Z_{5p}$ is applied across the resistance $R_2$ and the Zener diode $Z_{6p}$. As a result, the breakdown voltage of the Zener diode $Z_{6p}$ is applied to the power supply terminal $V_{DD}$ of the internal control circuit of the intelligent IGBT. Thus, the voltage applied to the power supply terminal $V_{DD}$ is further reduced by an amount corresponding to a voltage drop across the resistance $R_2$, as compared with that of the fifth embodiment.

When a surge voltage that is positive on the side of the source S is applied between the gate G and the source S, the forward voltage of the Zener diode $Z_{6p}$, which is smaller than the forward voltage of the Zener diode $Z_{1p}$ by amounts corresponding to voltage drops across the resistance $R_1$ and the resistance $R_2$, is applied to the power supply terminal $V_{DD}$ of the internal control circuit of the intelligent IGBT, as in the sixth embodiment. Thus, the voltage applied to the power supply terminal $V_{DD}$ is further reduced, thereby preventing breakdown caused by latch-up of a parasitic thyristor in the internal control circuit portion. In this manner, the influence of the surge voltage en the internal control circuit can be further reduced.

In particular, if the Zener diodes $Z_{5p}$, $Z_{6p}$ and the resistances $R_1$, $R_2$ are formed from polysilicon layers, the above-described problem of parasitic thyristor in the Zener diode portion can be avoided.

Eighth Embodiment

Figure 12:
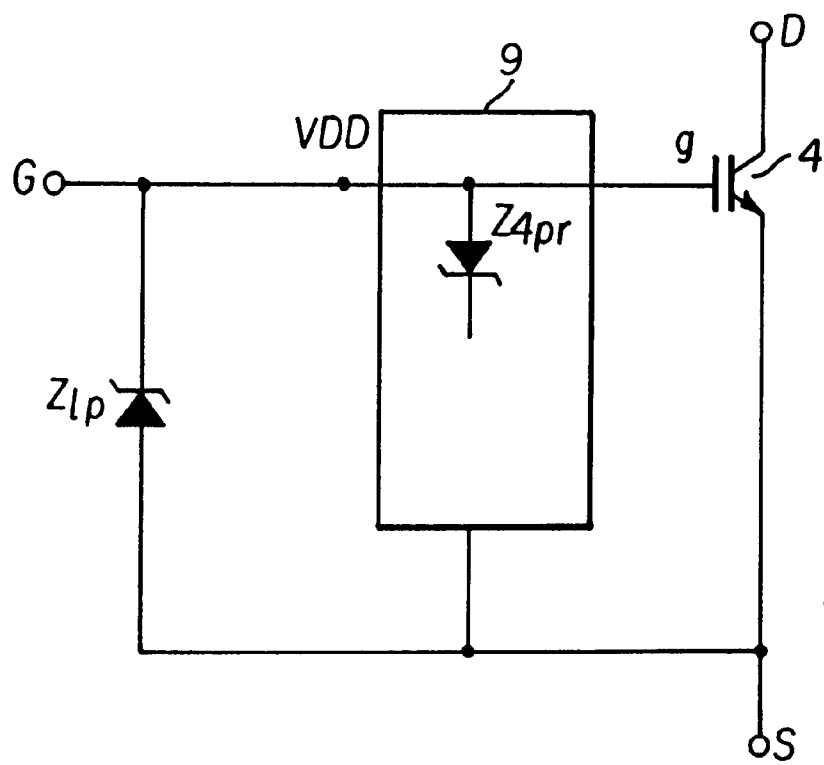
FIG. 12 is a circuit diagram showing an equivalent circuit of an intelligent IGBT according to the eighth embodiment of the present invention.

FIG. 12 is a circuit diagram showing an equivalent circuit of a protective Zener diode portion of a MOS type semiconductor device according to the eighth embodiment of the present invention.

In this embodiment, a Zener diode $Z_{1p}$ consisting of a polysilicon layer is connected between the gate G and the source S, so as to protect the device from surge voltage. The junction length of the Zener diode $Z_{1p}$ is preferably controlled to 10 mm or greater, as in the first embodiment. Furthermore, a Zener diode $Z_{4p}$ consisting of a polysilicon layer and having a reverse polarity with respect to the Zener diode $Z_{1p}$ is connected on the side of the power supply terminal $V_{DD}$ of the internal control circuit of the IGBT. A series Zener diode array between the gate g of the output-stage IGBT 4 and the drain D is not illustrated in FIG. 12.

With this arrangement, when a surge voltage that is positive on the side of the source S is applied between the gate G and the source S, this voltage is clamped to the forward voltage of the Zener diode $Z_{1p}$. While the thus clamped voltage is applied to the internal control circuit, this voltage is applied across the Zener diode $Z_{4p}$ if the breakdown voltage of the Zener diode $Z^{4pr}$ is sufficiently large, and latch-up of a parasitic thyristor in the internal control circuit as shown in FIG. 17 can be prevented.

In particular, if Zener diode $Z_{4pr}$ is formed from a polysilicon layer, the Zener diode portion is free from a problem of a parasitic thyristor that would appear if the Zener diode was formed in the semiconductor substrate, and is thus able to perform operations with high reliability.

Ninth Embodiment

Figure 13:
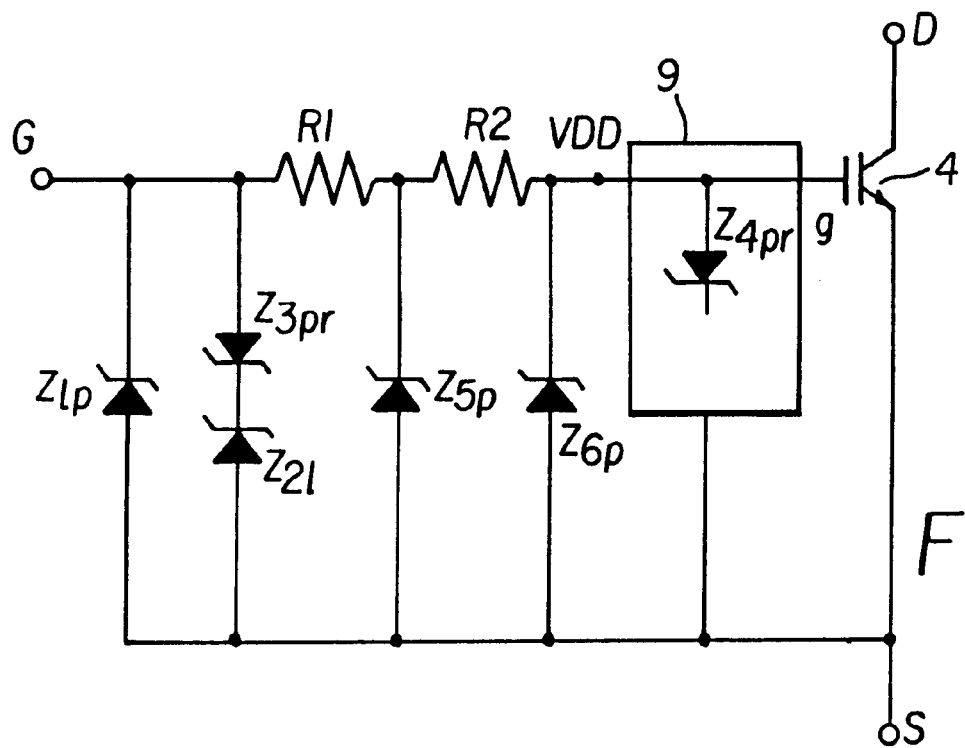
FIG. 13 is a circuit diagram showing an equivalent circuit of an intelligent IGBT according to the ninth embodiment of the present invention.
Figure 14:
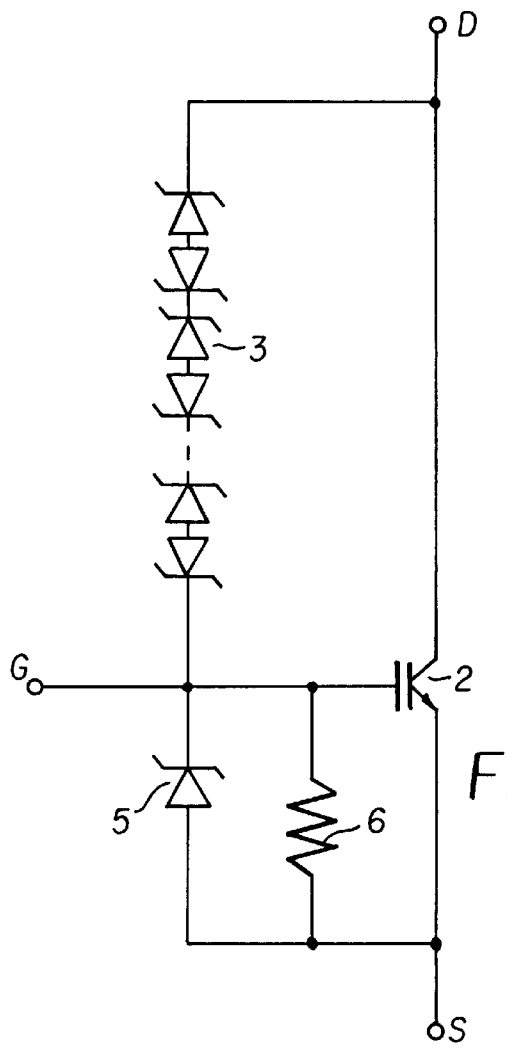
FIG. 14 is a circuit diagram showing a known MOSFET having Zener diodes for protecting the device.

FIG. 13 is a circuit diagram showing an equivalent circuit of a protective Zener diode portion of a MOS type semiconductor apparatus according to the ninth embodiment of the present invention. This embodiment is an improvement of the seventh embodiment of FIG. 11.

In the circuit arrangement shown in FIG. 13, a Zener diode $Z_{1p}$ consisting of a polysilicon layer is connected between the gate G and the source S, and a Zener diode $Z_{21}$ formed in the semiconductor substrate and a Zener diode $Z_{3pr}$ consisting of a polysilicon layer and is oriented in a reverse direction with respect to the Zener diode $Z_{21}$ are connected in parallel with the Zener diode $Z_{1p}$. Further, a resistance $R_1$ and a Zener diode $Z_{5p}$ are connected between the gate G and the source S, and a resistance $R_2$ and a Zener diode $Z_{6p}$ are connected in parallel with the Zener diode $Z_{5p}$. As in the seventh embodiment, a point between the resistance $R_2$ and the Zener diode $Z_{6p}$ is connected to the power supply terminal $V_{DD}$ of the internal control circuit. In addition, a Zener diode $Z_{4pr}$ consisting of a polysilicon layer and having a reverse polarity with respect to the Zener diode $Z_{1p}$ is connected on the side of the power supply terminal $V_{DD}$ of the internal control circuit of the IGBT. A series Zener diode array provided between the gate g of the output-stage IGBT 4 and the drain D is not illustrated in FIG. 13.

The breakdown voltage of the Zener diode $Z_{5p}$ is made smaller than the sum of the breakdown voltage of the Zener diode $Z_{21}$ and the forward voltage of the Zener diode $Z_{3pr}$. The junction length of the Zener diode $Z_{21}$ is preferably controlled to 1 mm or greater as in the second embodiment. The breakdown voltage of the Zener diode $Z_{6p}$ is made equal to or smaller than that of the Zener diode $Z_{5p}$.

With this arrangement, when a surge voltage that is positive on the side of the gate C is applied between the gate G and the source S, this voltage is clamped to the sum of the breakdown voltage of the Zener diode $Z_{21}$ formed in the semiconductor substrate, and the forward voltage of the reverse-oriented Zener diode $Z_{3pr}$ consisting of the polysilicon layer, and the thus clamped voltage is then applied across the resistance $R_1$ and the Zener diode $Z_{5p}$, as in the seventh embodiment. Then, the breakdown voltage of the Zener diode $Z_{5p}$ is applied across the resistance $R_2$ and the Zener diode $Z_{6p}$, and the breakdown voltage of the Zener diode $Z_{6p}$ is applied to the power supply terminal $V_{DD}$ of the internal control circuit of the intelligent IGBT. Thus, the voltage applied to the power supply terminal $V_{DD}$ is reduced by amounts corresponding to voltage drops across the resistances $R_1$, $R_2$, as compared with the clamp voltage as indicated above. In this manner, the area of the protective Zener diode portion can be reduced, and the problem of latch-up of a parasitic thyristor in this portion can be avoided. In addition, a similar effect as obtained in the eighth embodiment may be provided.

When a surge voltage that is positive on the side of the source S is applied between the gate G and the source S, the forward voltage of the Zener diode $Z_{1p}$ is applied across the resistance $R_1$ and the Zener diode $Z_{5p}$, and the forward voltage of the Zener diode $Z_{5p}$ is applied across the resistance $R_2$ and the Zener diode $Z_{6p}$. As a result, the forward voltage of the Zener diode $Z_{6p}$ is applied to the internal control circuit of the intelligent IGBT. Accordingly, the voltage applied to the internal control circuit has been considerably reduced as compared with the forward voltage of the Zener diode $Z_{1p}$. In addition, since the Zener diode $Z_{4pr}$ consisting of a polysilicon layer and having a reverse polarity with respect to the Zener diode $Z_{1p}$ is connected on the side of the power supply terminal $V_{DD}$ of the internal control circuit, the voltage that has been reduced as described above is applied across the Zener diode $Z_{4pr}$, and the internal control circuit portion is more securely protected against latch-up of a parasitic thyristor as shown in FIG. 17.

In particular, if the Zener diode $Z_{4pr}$ is formed from a polysilicon layer, the Zener diode portion does not suffer from a problem of parasitic thyristor, which would occur if the Zener diode was formed in the semiconductor substrate, and is thus able to perform reliable operations.

Other examples may be easily derived by making similar improvements on the MOS type semiconductor apparatuses of the second embodiment through the sixth embodiment.

While the illustrate embodiments are concerned with intelligent IGBTs, the present invention is not limited to intelligent semiconductor apparatuses having sensing portions, but may be equally applied to ordinary MOSFET, IGBT and other devices.

According to the present invention as explained above, it is found important to appropriately control the distance between the main MOS semiconductor device and the MOS semiconductor device(s) of the internal control circuit, the amount of impurities in an isolation well, and the distance between the lead electrode and the MOS semiconductor device(s) of the internal control circuit, in order to prevent latch-up of a parasitic thyristor.

In particular, the MOS semiconductor apparatus is provided with a protecting device that includes a first branch having a first Zener diode ($Z_1$d consisting of a polysilicon layer deposited on an insulating film over the semiconductor substrate, and a second branch having a second Zener diode ($Z_{21}$) formed in a surface layer of the semiconductor substrate, and a third diode ($Z_{1pr}$) consisting of a polysilicon layer deposited on an insulating film over the semiconductor substrate, and connected in series with the second Zener diode in a reverse direction, such that the first and second branches are connected in parallel with each other. The MOS type semiconductor apparatus thus constructed is free from latch-up of a parasitic thyristor, and requires a reduced area for the protecting device.

If a first branch including a Zener diode and a second branch in which a resistance and a Zener diode are connected in series are connected between the control input terminal (G) and one of the output terminals (S) of the apparatus, the voltage clamped to the breakdown voltage or forward voltage of the Zener diode of the first branch may be reduced by an amount corresponding to a voltage drop across the resistance, and the load applied to the internal control circuit of the MOS type semiconductor device can be thus reduced. This reduces an influence of surge voltage on tile device, and prevents latch-up of a parasitic thyristor. Furthermore, a large number of stages each including the combination of resistance and Zener diode may be provided, so as to further reduce the influence of the surge voltage and ensure a reliable operation of the device.

In recent years, MOS type semiconductor apparatuses serving as switching elements in switching circuits for an inductive load, such as those for use in ignitors, are increasingly subjected to severe stresses, because of simplification of the circuit from which snubbers are eliminated, and reduction in the size of the device). In this situation, the present invention as described above makes a great contribution to an improvement in the capability to withstand breakdown as a. dynamic characteristic of the device.

What is claimed is:
1. A MOS type semiconductor apparatus comprising:
  a semiconductor substrate;
  a main MOS type semiconductor device including a control portion of a metal-oxide film-semiconductor (MOS) structure;

a first output terminal and a second output terminal to which two outputs of said main MOS type semiconductor device are connected;

a control input terminal to which a control input of said main MOS type semiconductor device is connected;

an internal control circuit connected between said control input terminal and the control input of said main MOS type semiconductor device; and a protecting device connected between said control input terminal and said first output terminal, for protection against overvoltage, said protecting device comprising a first branch including a first Zener diode comprising a polysilicon layer deposited on an insulating film over said semiconductor substrate, and a second branch including a second Zener diode formed in a surface layer of the semiconductor substrate and a third diode comprising a polysilicon layer deposited on an insulating film over said semiconductor substrate, said third diode being connected in series with said second Zener diode in a reverse direction, said first and second branches being connected in parallel with each other; wherein said second Zener diode has a junction length of not smaller than 1 mm.

2. A MOS type semiconductor apparatus comprising:

a semiconductor substrate;

a main MOS type semiconductor device including a control portion of a metal-oxide film-semiconductor (MOS) structure;

a first output terminal and a second output terminal to which two outputs of said main MOS type semiconductor device are connected;

a control input terminal to which a control input of said main MOS type semiconductor device is connected, an internal control circuit connected between said control input terminal and the control input of said main MOS type semiconductor device; and a protecting device connected between said control input terminal and said first output terminal for protection against overvoltage, said protecting device comprising a first branch including a first Zener diode comprising a polysilicon layer deposited on an insulating film over said semiconductor substrate, and a second branch including a second Zener diode formed in a surface layer of the semiconductor substrate and a third diode comprising a polysilicon layer deposited on an insulating film over said semiconductor substrate, said third diode being connected in series with said second Zener diode in a reverse direction, said first and second branches being connected in parallel with each other; wherein a sum of a breakdown voltage of said second Zener diode and a forward voltage of said third diode is equal to or smaller than a breakdown voltage of said first Zener diode.

3. A MOS type semiconductor apparatus comprising:

a semiconductor substrate;

a main MOS type semiconductor device including a control portion of a metal-oxide film-semiconductor (MOS) structure;

a first output terminal and a second output terminal to which two outputs of said main MOS type semiconductor device are connected;

a control input terminal to which a control input of said main MOS type semiconductor device is connected;

an internal control circuit connected between said control input terminal and the control input of said main MOS type semiconductor device; and a protecting device connected between said control input terminal and said first output terminal, for protection against overvoltage, said protecting device comprising a first branch comprising a first Zener diode, and a second branch in which a resistance and a second Zener diode are connected in series, such that a point between said resistance and said second Zener diode is connected to said control input of said main MOS type semiconductor device, said first branch and said second branch being connected in parallel with each other, said first Zener diode, said resistance, and said second Zener diode being formed on an insulating film over said semiconductor substrate.

4. A MOS type semiconductor apparatus comprising:

a semiconductor substrate;

a main MOS type semiconductor device including a control portion of a metal-oxide film-semiconductor (MOS) structure;

a first output terminal and a second output terminal to which two outputs of said main MOS type semiconductor device are connected;

a control input terminal to which a control input of said main MOS type semiconductor device is connected;

an internal control circuit connected between said control input terminal and the control input of said main MOS type semiconductor device; and a protecting device connected between said control input terminal and said first output terminal, for protection against overvoltage, said protecting device comprising a Zener diode provided between the control input terminal and the first output terminal, a plurality of resistances that are connected in series between said control input terminal and said control input of said main MOS type semiconductor device, and a plurality of Zener diodes each of which is connected between one side of a corresponding one of said resistances that is close to the control input of the main MOS type semiconductor device, and said first output terminal, said plurality of resistances and said plurality of Zener diodes being formed on an insulating film over said semiconductor substrate.

5. A MOS type semiconductor apparatus comprising:

a semiconductor substrate;

a main MOS type semiconductor device including a control portion of a metal-oxide film-semiconductor (MOS) structure;

a first output terminal and a second output terminal to which two outputs of said main MOS type semiconductor device are connected;

a control input terminal to which a control input of said main MOS type semiconductor device is connected;

an internal control circuit connected between said control input terminal and the control input of said main MOS type semiconductor device; and a semiconductor substrate; and a protecting device connected between said control input terminal and said first input terminal, for protection against overvoltage, said protecting device comprising a Zener diode comprising a polysilicon layer deposited on an insulating film over said semiconductor substrate, and a diode that is oriented in a reverse direction with respect to said Zener diode, and located on the side of a power supply terminal of said internal control circuit.

6. A MOS type semiconductor apparatus according to claim 3 or 4, wherein each of said resistances and said Zener diodes is formed of polysilicon.

7. A MOS type semiconductor apparatus according to any one of claims 3 and 4, wherein each of said Zener diodes comprises a polysilicon layer deposited on an insulating film over said semiconductor substrate, and wherein said protecting device further comprise a diode that is oriented in a reverse direction with respect to said Zener diode, and located on the side of a power supply terminal of said internal control circuit.

8. A MOS type semiconductor apparatus according to any one of claims 3, 4 and 5, wherein at least one of said Zener diodes includes comb-like electrodes.

9. A MOS type semiconductor apparatus according to any one of claims 3, 4 and 5, wherein said internal control circuit comprises a MOS type semiconductor device that includes a control portion of a metal-oxide film-semiconductor (MOS) structure, and is integrated with a self-isolation region or a junction isolation region formed in a surface layer of said semiconductor substrate, and wherein a channel region of said main MOS type semiconductor device is spaced at least 200 µm from a channel region of said MOS type semiconductor device of said internal control circuit.

10. A MOS type semiconductor apparatus comprising:
a semiconductor substrate;
a main MOS type semiconductor device including a control portion of a metal-oxide film-semiconductor (MOS) structure;
a first output terminal and a second output terminal to which two outputs of said main MOS type semiconductor device are connected;
a control input terminal to which a control input of said main MOS type semiconductor device is connected;
an internal control circuit connected between said control input terminal and the control input of said main MOS type semiconductor device; and
a protecting device connected between said control input terminal and said first output terminal, for protection against overvoltage, said protecting device comprising a first branch including a first Zener diode comprising a polysilicon layer deposited on an insulating film over said semiconductor substrate, and a second branch including a second Zener diode formed in a surface layer of the semiconductor substrate and a third diode comprising a polysilicon layer deposited on an insulating film over said semiconductor substrate, said third diode being connected in series with said second Zener diode in a reverse direction, said first and second branches being connected in parallel with each other;
wherein said protecting device further comprises a branch in which a resistance and a Zener diode are connected in series, such that a point between the resistance and the Zener diode is connected to said control input of said main MOS type semiconductor device.

11. A MOS type semiconductor apparatus comprising:
a semiconductor substrate;
a main MOS type semiconductor device including a control portion of a metal-oxide film-semiconductor (MOS) structure;
a first output terminal and a second output terminal to which two outputs of said main MOS type semiconductor device are connected;
a control input terminal to which a control input of said main MOS type semiconductor device is connected;
an internal control circuit connected between said control input terminal and the control input of said main MOS type semiconductor device; and
a protecting device connected between said control input terminal and said first output terminal, for protection against overvoltage, said protecting device comprising a first branch including a first Zener diode comprising a polysilicon layer deposited on an insulating film over said semiconductor substrate, and a second branch including a second Zener diode formed in a surface layer of the semiconductor substrate and a third diode comprising a polysilicon layer deposited on an insulating film over said semiconductor substrate, said third diode being connected in series with said second Zener diode in a reverse direction, said first and second branches being connected in parallel with each other;
wherein said protecting device further comprises a plurality of resistances that are connected in series between said control input terminal and said control input of said main MOS type semiconductor device, and a plurality of Zener diodes each of which is connected between one side of corresponding one of said resistances that is closer to the control input port of the main MOS type semiconductor device, and said first output terminal.

12. A MOS type semiconductor apparatus comprising:
a semiconductor substrate;
a main MOS type semiconductor device including a control portion of a metal-oxide film-semiconductor (MOS) structure;
a first output terminal and a second output terminal to which two outputs of said main MOS type semiconductor device are connected;
a control input terminal to which a control input of said main MOS type semiconductor device is connected; and
an internal control circuit connected between said control input terminal and the control input of said main MOS type semiconductor device, said internal control circuit comprising a MOS ()type semiconductor device that includes a control portion of a metal-oxide film-semiconductor (MOS) structure, and is integrated within a self-isolation region or a junction isolation region formed in a surface layer of said semiconductor substrate,
wherein a channel region of said main MOS type semiconductor device is spaced at least 200 µm from a channel region of said MOS type semiconductor device of said internal control circuit.

13. A MOS type semiconductor device according to claim 12, wherein an amount of impurities in said self isolation region or junction isolation region formed in the surface layer of the semiconductor substrate is in a range of $1\times10^{13}$ to $1\times10^{14}$ cm$^{-2}$.

14. A MOS type semiconductor apparatus according to claim 12, further comprising a lead electrode that is formed in contact with a surface of said self isolation region or said junction isolation region, and connected to said first output terminal, said lead electrode being spaced from said channel region of said MOS type semiconductor device of said internal control circuit by a distance of not greater than 100 µm.

15. A MOS type semiconductor apparatus comprising:
a semiconductor substrate;
a main MOS type semiconductor device including a control portion of a metal-oxide film-semiconductor (MOS) structure;
a first output terminal and a second output terminal to which two outputs of said main MOS type semiconductor device are connected;

a control input terminal to which a control input of said main MOS type semiconductor device is connected;

an internal control circuit connected between said control input terminal and the control input of said main MOS type semiconductor device; and a protecting device connected between said control input terminal and said first output terminal, for protection against overvoltage, said protecting device comprising a first branch including a first Zener diode comprising a polysilicon layer deposited on an insulating film over said semiconductor substrate, and a second branch including a second Zener diode formed in a surface layer of the semiconductor substrate and a third diode comprising a polysilicon layer deposited on an insulating film over said semiconductor substrate, said third diode being connected in series with said second Zener diode in a reverse direction, said first and second branches being connected in parallel with each other;

wherein each of said Zener diodes comprises a polysilicon layer deposited on an insulating film over said semiconductor substrate, and wherein said protecting device further comprise a diode that is oriented in a reverse direction with respect to said Zener diode, and located on the side of a power supply terminal of said internal control circuit.

* * * * *